(12) United States Patent
Chang et al.

(10) Patent No.: US 11,476,337 B2
(45) Date of Patent: Oct. 18, 2022

(54) METHOD FOR FORMING A SEMICONDUCTOR STRUCTURE

(71) Applicant: TAIWAN SEMICONDUCTOR MANUFACTURING COMPANY LTD., Hsinchu (TW)

(72) Inventors: Yao-Wen Chang, Taipei (TW); Gung-Pei Chang, Taipei (TW); Ching-Sheng Chu, Hsinchu County (TW); Chern-Yow Hsu, Hsin-Chu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/021,725

(22) Filed: Sep. 15, 2020

(65) Prior Publication Data
US 2021/0020752 A1   Jan. 21, 2021

Related U.S. Application Data

(62) Division of application No. 15/962,454, filed on Apr. 25, 2018, now Pat. No. 10,790,362.

(60) Provisional application No. 62/593,042, filed on Nov. 30, 2017.

(51) Int. Cl.
*H01L 29/26* (2006.01)
*H01L 21/02* (2006.01)
*H01L 21/768* (2006.01)

(52) U.S. Cl.
CPC .......... *H01L 29/26* (2013.01); *H01L 21/0228* (2013.01); *H01L 21/02172* (2013.01); *H01L 21/02304* (2013.01); *H01L 21/76816* (2013.01); *H01L 21/76831* (2013.01); *H01L 21/76871* (2013.01); *H01L 21/76889* (2013.01)

(58) Field of Classification Search
CPC ............... H01L 29/26; H01L 21/76816; H01L 21/76889; H01L 21/02172; H01L 21/76831; H01L 21/76871; H01L 21/02304; H01L 21/0228
See application file for complete search history.

(56) References Cited

U.S. PATENT DOCUMENTS

| | | | | |
|---|---|---|---|---|
| 6,326,301 | B1 * | 12/2001 | Venkatesan | ....... H01L 21/76834 438/618 |
| 2010/0219502 | A1 * | 9/2010 | Shieh | ....................... H01L 28/40 257/532 |
| 2015/0364366 | A1 * | 12/2015 | Kim | ................... H01L 27/10814 438/396 |
| 2016/0379878 | A1 * | 12/2016 | Anderson | .......... H01L 21/02164 257/754 |

(Continued)

*Primary Examiner* — Julia Slutsker
(74) *Attorney, Agent, or Firm* — WPAT, P.C., Intellectual Property Attorneys; Anthony King

(57) ABSTRACT

The present disclosure provides a method for forming a semiconductor structure. The method includes the following operations. A metal layer is formed. An adhesion-enhancing layer is formed over the metal layer by a silicide operation. A dielectric stack is formed over the adhesion-enhancing layer. A trench is formed in the dielectric stack by removing a portion of dielectric stack aligning with the metal layer. A barrier layer is formed conforming to the sidewall of the trench. A high-k dielectric layer is formed conforming to the barrier layer. A contact is formed in the trench and be connected to the metal layer.

20 Claims, 22 Drawing Sheets

(56) References Cited

U.S. PATENT DOCUMENTS

| | | | |
|---|---|---|---|
| 2017/0222008 A1* | 8/2017 | Hsu | H01L 21/76802 |
| 2018/0082942 A1* | 3/2018 | Chawla | H01L 21/76819 |

* cited by examiner

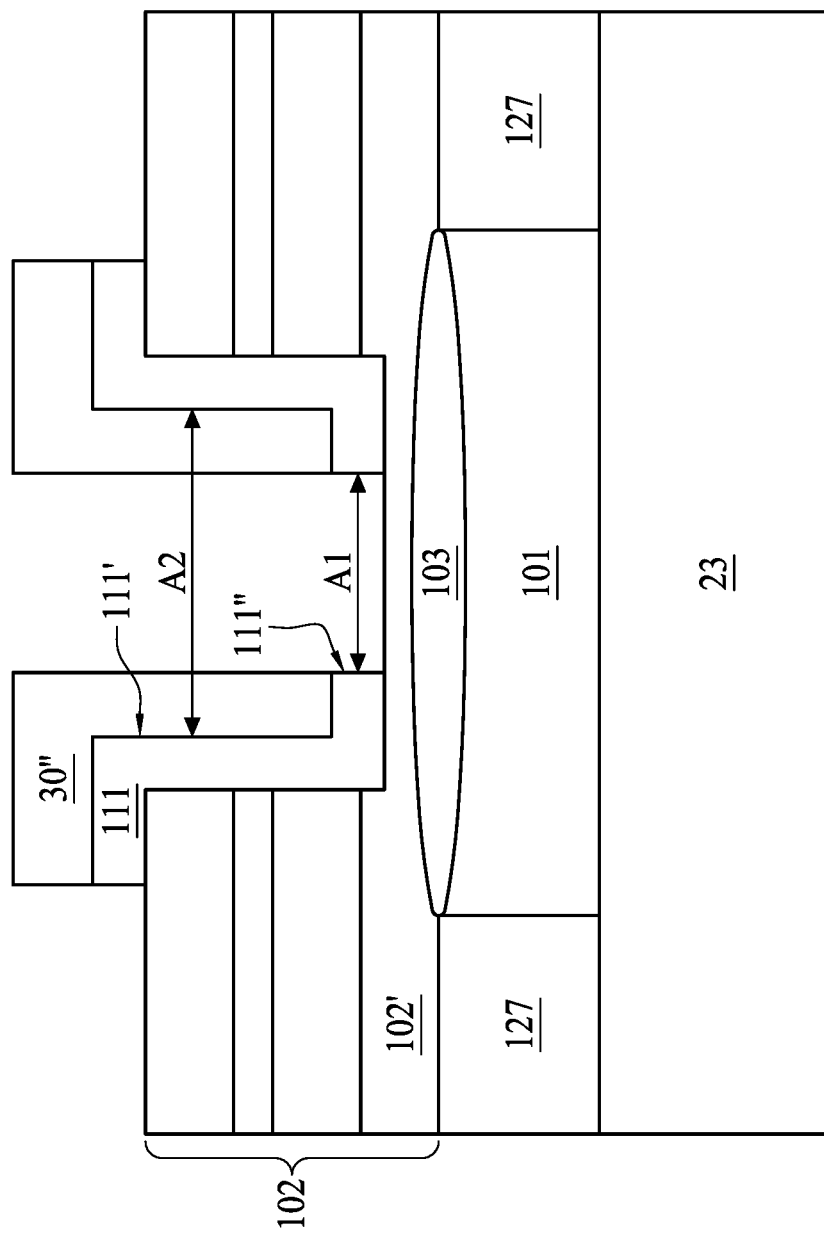

METHOD FOR FORMING A SEMICONDUCTOR STRUCTURE

CROSS REFERENCE TO RELATED APPLICATIONS

This application is a divisional application to prior-filed U.S. application Ser. No. 15/962,454, filed Apr. 25, 2018 and claims the benefit of prior-filed U.S. provisional application No. 62/593,042, filed Nov. 30, 2017, under 35 U.S.C. 120.

BACKGROUND

High-voltage transistors are semiconductor devices that can operate at high supply voltages. High voltage integrated circuits including high voltage transistors are widely used in applications for the display drivers. For example, high voltage transistors can be integrated in a gate driver IC to supply display signals to a high voltage display.

Conventionally hydrofluoride vapor (HF) operation is applied during manufacturing high voltage display. However, due to poor adhesion between copper line and passivation layer, the high voltage display structure prones to suffer passivation film delamination after the hydrofluoride vapor (HF) operation. In addition, hydrofluoride vapor (HF) may also induce lateral holes on the passivation sidewalls or oxidized passivation sidewalls.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
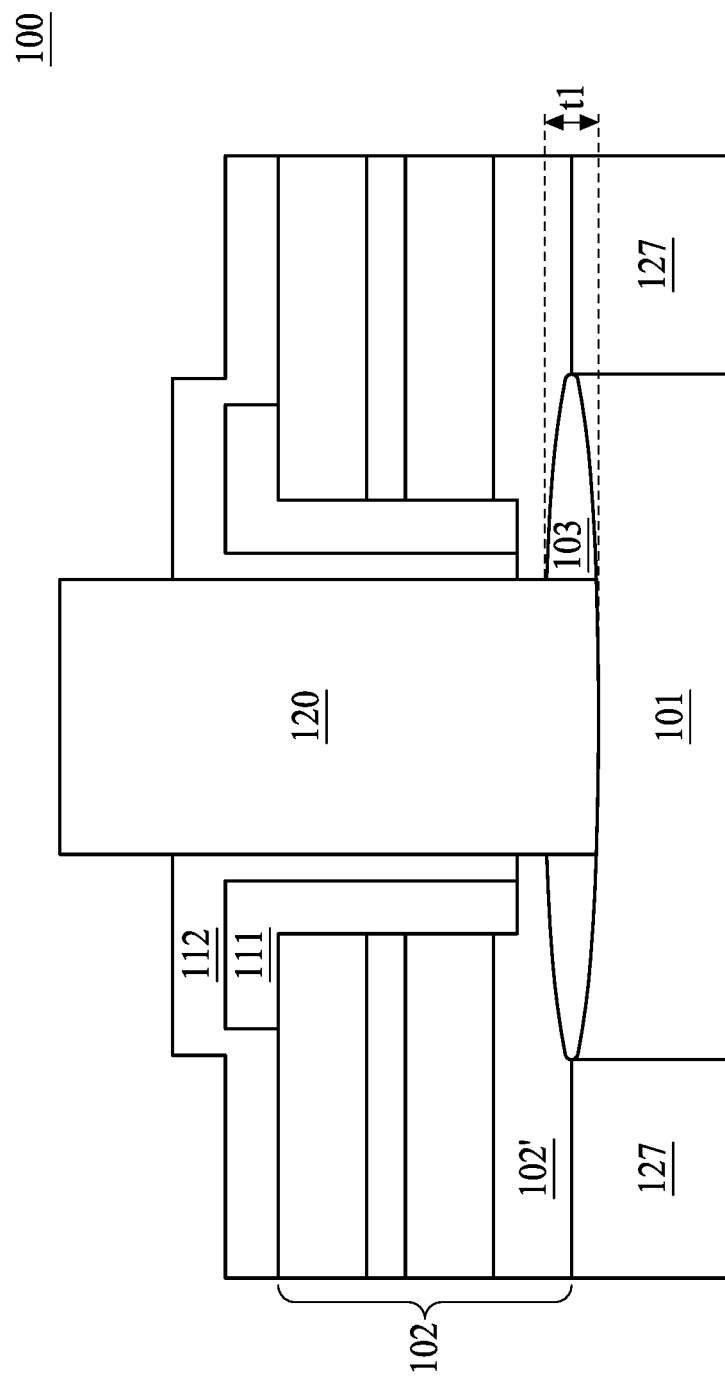
FIGS. 1A and 1B are cross sections of a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The conventional display structure includes oxides-nitrides stack deposited above a metal line, further covered by a high-k oxide layer. However, while a hydrofluoride vapor (HF) operation is applied after bonding a display driver to a substrate, the hydrofluoride vapor (HF) is tend to induce lateral recesses at most oxides or nitrides layers. As a result, the interface between the high-k oxide layer and the oxides-nitrides stack may be laterally etched. Hydrofluoride vapor (HF) may also induce lateral holes on sidewalls of oxides-nitrides stack. Furthermore, lateral etch on nitrides layer may induce poor adhesion between copper line and nitrides layers, thence the high voltage display structure prones to suffer delamination after the hydrofluoride vapor (HF) operation. In addition, during the deposition of the high-k oxide layer, the oxides-nitrides stack may be oxidized by oxidation agents such as water containing precursors.

The present disclosure provides a semiconductor structure, a high voltage display structure, and a method for forming the semiconductor structure.

Referring to FIG. 1A, FIG. 1A is a cross section of a semiconductor structure 100, in accordance with some embodiments of the present disclosure. A metal layer 101 is disposed over at least a transistor structure (not shown in FIG. 1A). In some embodiments, the metal layer referred herein includes metal lines and metal vias composed of copper or copper alloy. Metal lines and metal vias in different metal layers form an interconnect structure composed of substantially pure copper (for example, with a weight percentage of copper being greater than about 90 percent, or greater than about 95 percent) or copper alloys, and may be formed using the single and/or dual damascene processes. Metal lines and metal vias may be, or may not be, substantially free from aluminum. Interconnect structure includes a plurality of metal layers. In some embodiments, metal layer 101 is formed in inter-metal dielectrics (IMDs) 127, which may be formed of oxides such as un-doped Silicate Glass (USG), Fluorinated Silicate Glass (FSG), low-k dielectric materials, or the like. The low-k dielectric materials may have k values lower than 3.8, although the dielectric materials of IMDs 127 may also be close to 3.8. In some embodiments, the k values of the low-k dielectric materials are lower than about 3.0, and may be lower than about 2.5. The metal layer 101 may be formed by a variety of techniques, e.g., electroplating, electroless plating, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like.

In some embodiments, an adhesion-enhancing layer 103 is disposed above the metal line 101. In some embodiments, the adhesion-enhancing layer 103 may include copper, silicide, metal silicide, copper-silicon alloys, or the like. A dielectric stack 102 is disposed over the adhesion-enhancing layer 103. In some embodiments, the dielectric stack 102 may include a silicon-rich silicon nitride (Si-rich SiN) layer 102' interfacing with the adhesion-enhancing layer 103. The adhesion-enhancing layer 103 may help improve the adhesion between the dielectric stack 102 and the metal line 101, providing a higher yield strength against yielding force applied on the dielectric stack 102 and the metal line 101. In some embodiments, the adhesion-enhancing layer 103 possesses a thickness t1 of ranging from 50 Angstrom to about 100 Angstrom. If the thickness t1 is thinner than the range, the adhesion-enhancing layer 103 may not provide enough yield strength to resist yielding force; while the thickness t1 being thicker than the range may, induce a higher resistance that affect the conductivity of the structure.

A contact 120 penetrates through the dielectric stack 102, the adhesion-enhancing layer 103 and connects with the metal layer 101. In some embodiments, the contact 120 has a substantially constant width, as shown in FIG. 1A. A barrier layer 111 surrounds the contact 120 and laterally spaces the contact 120 and the dielectric stack 102. In some embodiments, a portion of the barrier layer 111 is above the dielectric stack 102. In some embodiments, the barrier layer 111 may include titanium nitride (TiN), titanium oxynitride (TiON), the combinations thereof, or the like. A high-k dielectric layer 112 is disposed above the barrier layer 111 and the dielectric stack 102 while surrounding the contact 120. The high-k dielectric layer 112 further laterally spacing the contact 120 and the barrier layer 111. In some embodiments, the contact 120 includes one or more types of high conductivity metal, for example, nickel (Ni), gold (Au), a combination of nickel (Ni) and gold (Au), or the like. In some embodiments, the high-k dielectric layer 112 may include aluminum oxide ($Al_2O_3$). However, the material of the high-k dielectric layer 112 is not limited herein. Any material that conventionally used as an etch stop to hydrofluoric vapor etching process are under consideration. In some embodiments, the semiconductor structure 100 can be used as a semiconductor driver for high voltage display.

Figure 1B:
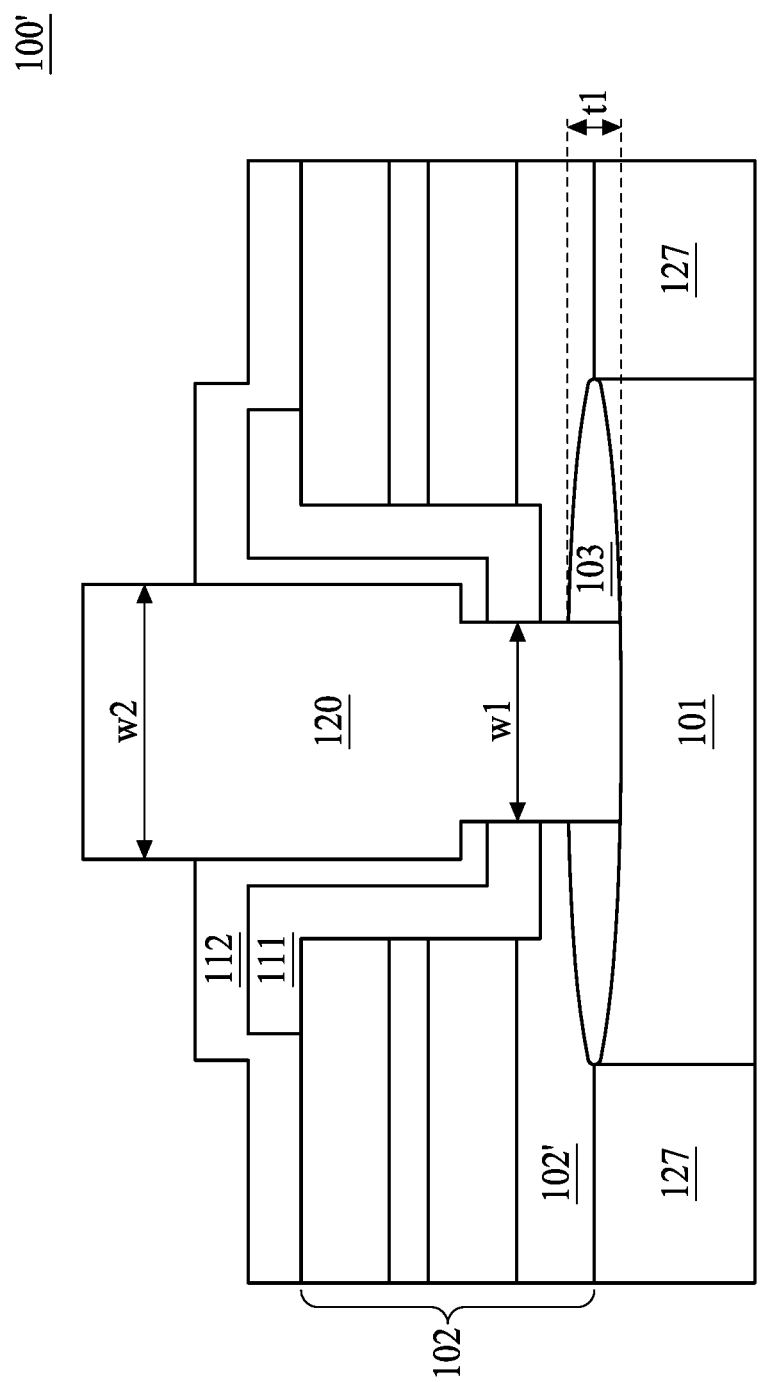

While in some other embodiments, referring to FIG. 1B, a cross section of a semiconductor driver 100' in accordance with some embodiments of the present disclosure, a portion of the contact 120 proximal to the metal layer 101 has a first width w1 narrower than a second width w2 of a portion of the contact 120 distal to the metal layer 101. A barrier layer 111 surrounds the contact 120 and laterally spaces the contact 120 and the dielectric stack 102. In some embodiments, a portion of the barrier layer 111 is above the dielectric stack 102. In some embodiments, the barrier layer 111 may include titanium nitride (TiN), titanium oxynitride (TiON), the combination thereof, or the like. A high-k dielectric layer 112 is disposed above the barrier layer 111 and the dielectric stack 102 while surrounding the contact 120. The high-k dielectric layer 112 further laterally spacing the contact 120 and the barrier layer 111. Both the high-k dielectric layer 102 and the barrier layer 111 extend underneath the portion of the contact 120 distal to the metal layer 101 and laterally contacting the portion of the contact 120 proximal to the metal layer 101. In some embodiments, the contact 120 includes one or more types of metal, for example, a combination of nickel (Ni) and gold (Au). In some embodiments, the high-k dielectric layer 112 may include aluminum oxide. However, the material of the high-k dielectric layer 112 is not limited herein. Any material that conventionally used as an etch stop to hydrofluoric vapor etching process are under consideration.

Figure 2A:
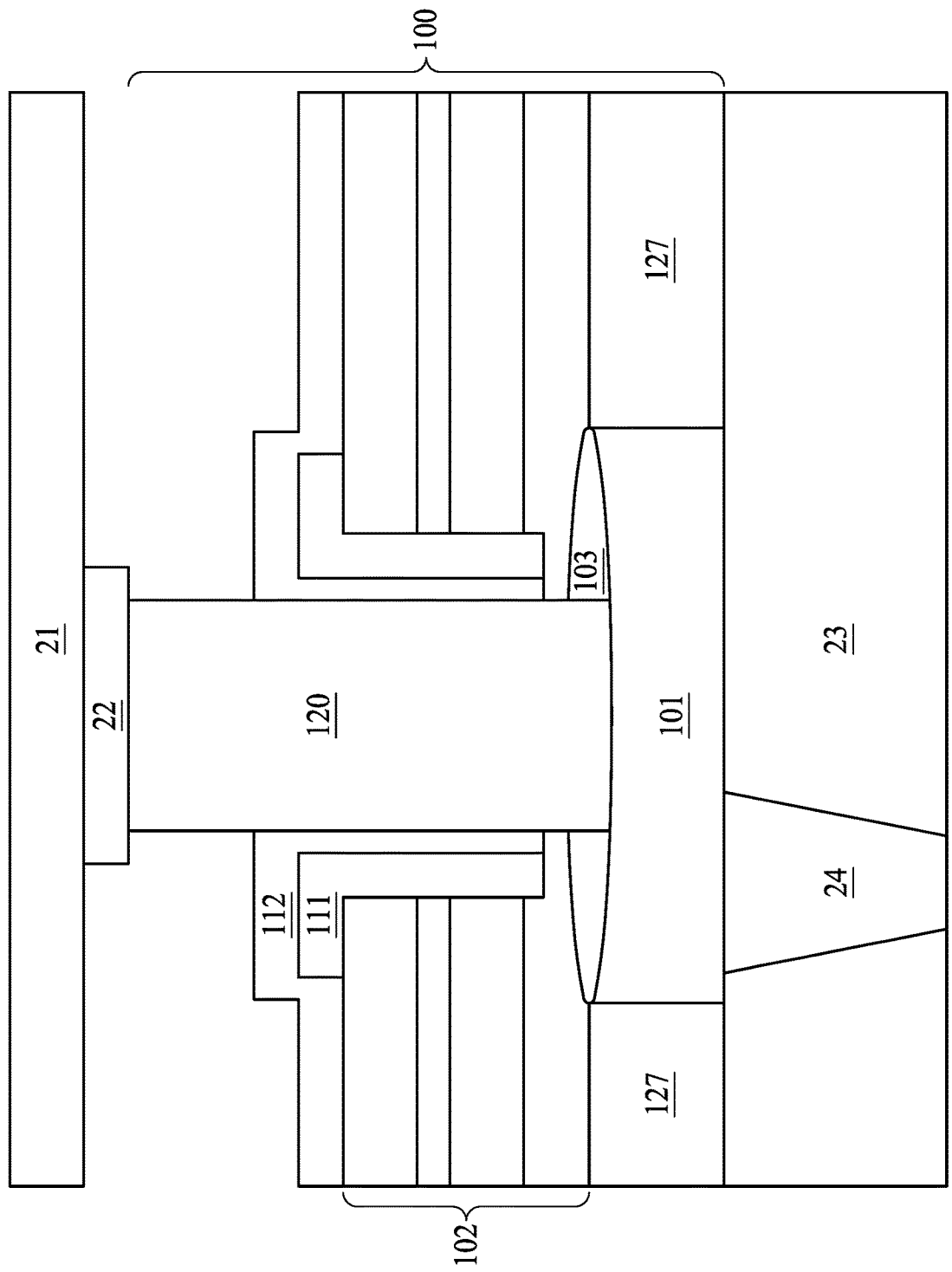
FIGS. 2A and 2B are a cross section of a high voltage display structure, in accordance with some embodiments of the present disclosure.

Referring to FIG. 2A, FIG. 2A is a cross section of a high voltage display structure in accordance with some embodiments of the present disclosure. A high voltage display structure can be formed by bonding the semiconductor structure 100 to a conductive pad 22 of a glass substrate 21. The glass substrate 21 is bonded to the semiconductor structure 100 through the contact 120 and the conductive pad 22. In some embodiments, the conductive pad 22 may include conductive metal, such as indium (In). The conductive pad 22 may or may not have the same material with the contact 120. In some embodiments, the semiconductor structure 100 may be disposed above a dielectric layer 23. The dielectric layer 23 may be disposed above or surrounding a metal line 24, one or more transistor structure, and/or one or more active devices (not shown in FIG. 2A). The metal line 24 may be electrically connected to the metal layer 101 and further couple with the contact 120 and the conductive pad 22. The material of the dielectric layer 23 may, or may not be the same with the 127. In some embodiments, the high voltage display structure may further include one or more high aspect ratio trenches (not shown in FIG. 2A) adjacent to the metal line 101.

Figure 2B:
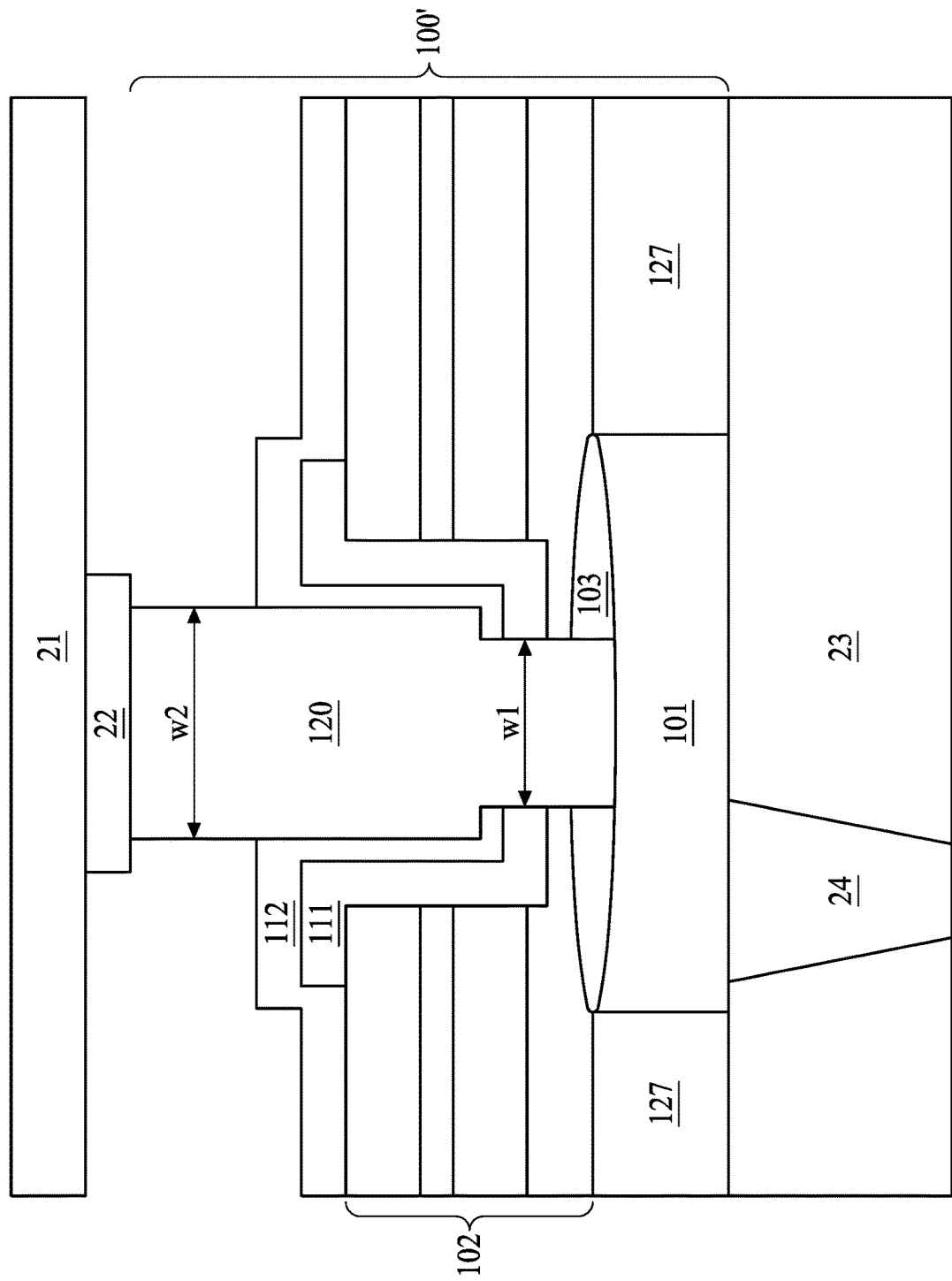

Referring to FIG. 2B, FIG. 2B is a cross section of a high voltage display structure in accordance with some embodiments of the present disclosure. A high voltage display structure can be formed by bonding the semiconductor driver 100' to a conductive pad 22 of a glass substrate 21. The glass substrate 21 is bonded to the semiconductor structure 100 through the contact 120 and the conductive pad 22. In some embodiments, the conductive pad 22 may include conductive metal, such as indium (In). The conductive pad 22 may or may not have the same material with the contact 120. In some embodiments, the semiconductor driver 100' may be disposed above a dielectric layer 23. The dielectric layer 23 may be disposed above or surrounding a metal line 24, one or more transistor structure, and/or one or more active devices (not shown in FIG. 2B). The metal line 24 may be electrically connected to the metal layer 101 and further couple with the contact 120 and the conductive pad 22. The material of the dielectric layer 23 may, or may not be the same with the IMDs 127. In some embodiments, the high voltage display structure may further include one or more high aspect ratio trenches (not shown in FIG. 2B) adjacent to the metal line 101.

Figure 3A:
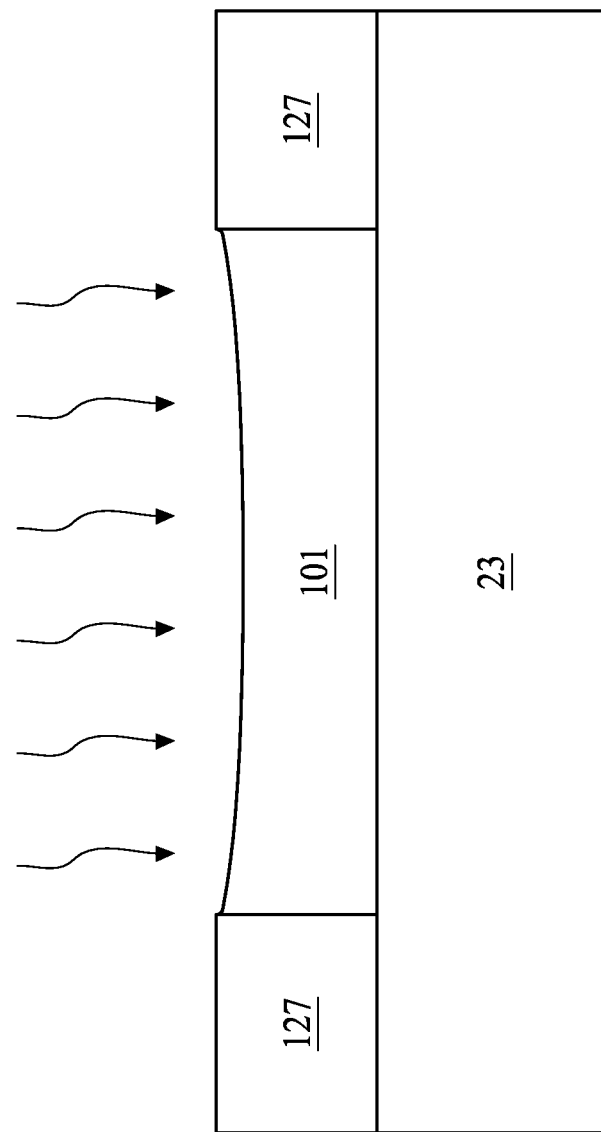
FIGS. 3A and 3B are cross sections of a semiconductor structure at various stages, in accordance with some embodiments of the present disclosure.

FIG. 3A to FIG. 12B are cross sections of a semiconductor structure fabricated at various stages, in accordance with some embodiments of the present disclosure. In FIG. 3A, a metal layer 101 is disposed over at least a transistor structure (not shown in FIG. 3A). In some embodiments, the metal layer referred herein includes metal lines and metal vias composed of copper or copper alloy. Metal lines and metal vias in different metal layers form an interconnect structure composed of substantially pure copper (for example, with a weight percentage of copper being greater than about 90 percent, or greater than about 95 percent) or copper alloys, and may be formed using the single and/or dual damascene processes. Metal lines and metal vias may be, or may not be, substantially free from aluminum. Interconnect structure includes a plurality of metal layers. In some embodiments, metal layer 101 is formed in inter-metal dielectrics (IMDs) 127, as the inter-metal dielectrics (IMDs) 127 is formed above the dielectric layer 23, which may be formed over one or more transistor structure, and/or one or more active devices. The inter-metal dielectrics (IMDs) 127 may include oxides such as un-doped Silicate Glass (USG), Fluorinated Silicate Glass (FSG), low-k dielectric materials, or the like. The low-k dielectric materials may have k values lower than 3.8, although the dielectric materials of IMDs 127 may also be close to 3.8. In some embodiments, the k values of the low-k dielectric materials are lower than about 3.0, and may be lower than about 2.5. The metal layer 101 may be formed by a variety of techniques, e.g., electroplating, electroless plating, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. The material of the dielectric layer 23 may, or may not be the same with the IMDs 127.

Figure 3B:
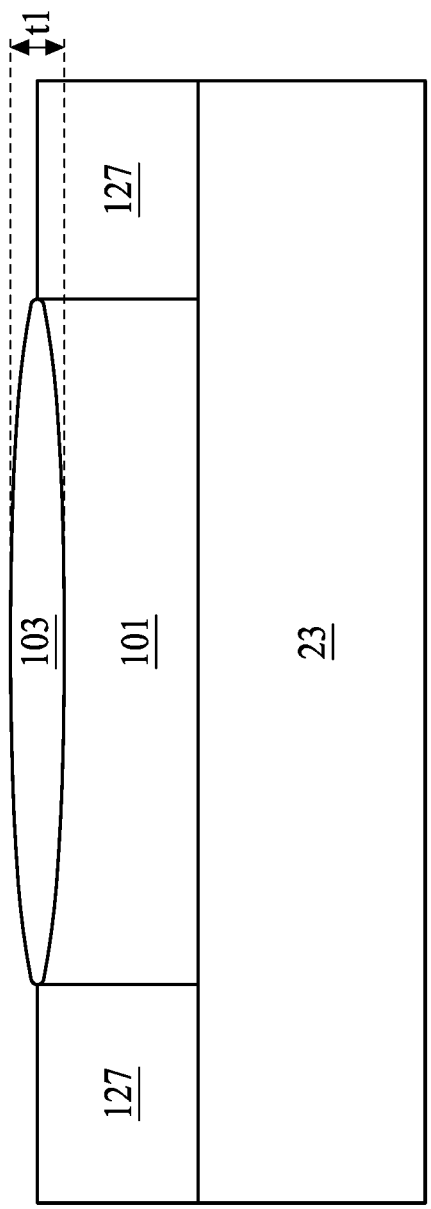

In FIG. 3B, an exposed surface of the metal line 101 is treated by silicide soaking operation. For example, by applying silane gas ($SiH_4$) on the exposed surface of the metal line 101, the adhesion-enhancing layer 103 may be formed over the metal layer 101. In some embodiments, the adhesion-enhancing layer 103 may include copper-silicon alloy. In some embodiments, a cross sectional profile of the adhesion-enhancing layer 103 may be non-uniform. For example, the cross sectional profile of the adhesion-enhancing layer 103 may have a thicker center and a thinner edge. Due to the CMP dishing effect, the metal line 101 immediately after CMP may process a concave recess profile at the top surface. Subsequently, silane is introduced to react with the metal line 101. Copper-silane reaction at the center of the top surface of the metal line 101 is more active than that of at an edge since more copper is exposed at the center than at the edge. The adhesion strength between the adhesion-enhancing layer 103 and the subsequently formed silicon-rich silicon nitride (Si-rich SiN) layer 102' (shown in FIG. 4) may be improved as a result of the aforesaid non-uniform profile.

Figure 4:
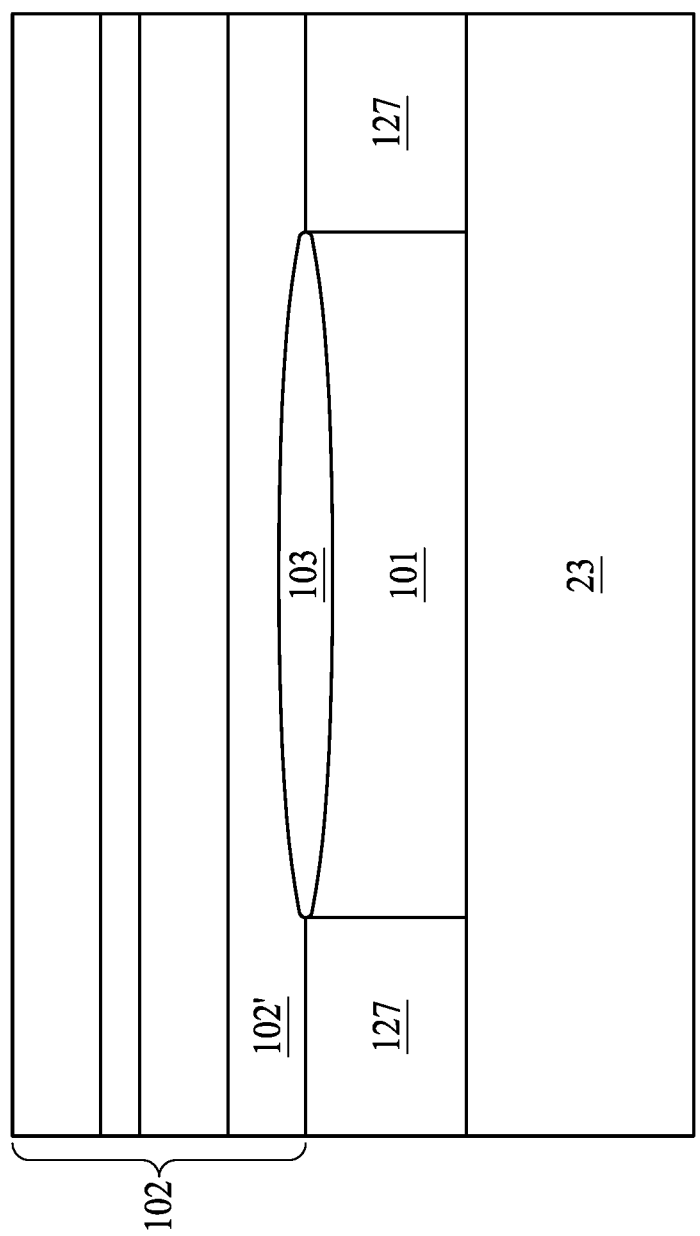
FIGS. 4 to 6 are cross sections of a semiconductor structure at various stages, in accordance with some embodiments of the present disclosure.

In FIG. 4, a dielectric stack 102 is formed over the adhesion-enhancing layer 103. In some embodiments, the dielectric stack 102 may include a silicon-rich silicon nitride (Si-rich SiN) layer 102' interfacing with the adhesion-enhancing layer 103. Note that the silicon-rich silicon nitride (Si-rich SiN) has a lower etch rate under hydrofluoride vapor etching process, as will be discussed in FIG. 12A and FIG. 12B. In some embodiments, the dielectric stack 102 may include layers of nitrides, oxides, silicides, carbides, or the like. In some embodiments, the dielectric stack 102 may include silicon oxide, silicon nitride, the combination thereof, or the like.

The adhesion-enhancing layer 103 may help improve the adhesion between the dielectric stack 102 and the metal line 101, providing a higher yield strength against yielding force applied on the dielectric stack 102 and the metal line 101. In some embodiments, the adhesion-enhancing layer 103 possesses a thickness t1 of ranging from 50 Angstrom to about 100 Angstrom. If the thickness a is thinner than the range, the adhesion-enhancing layer 103 may not provide enough yield strength to resist yielding force; while the thickness t1 being thicker than the range may induce a higher resistance that affect the conductivity of the structure.

Figure 5:
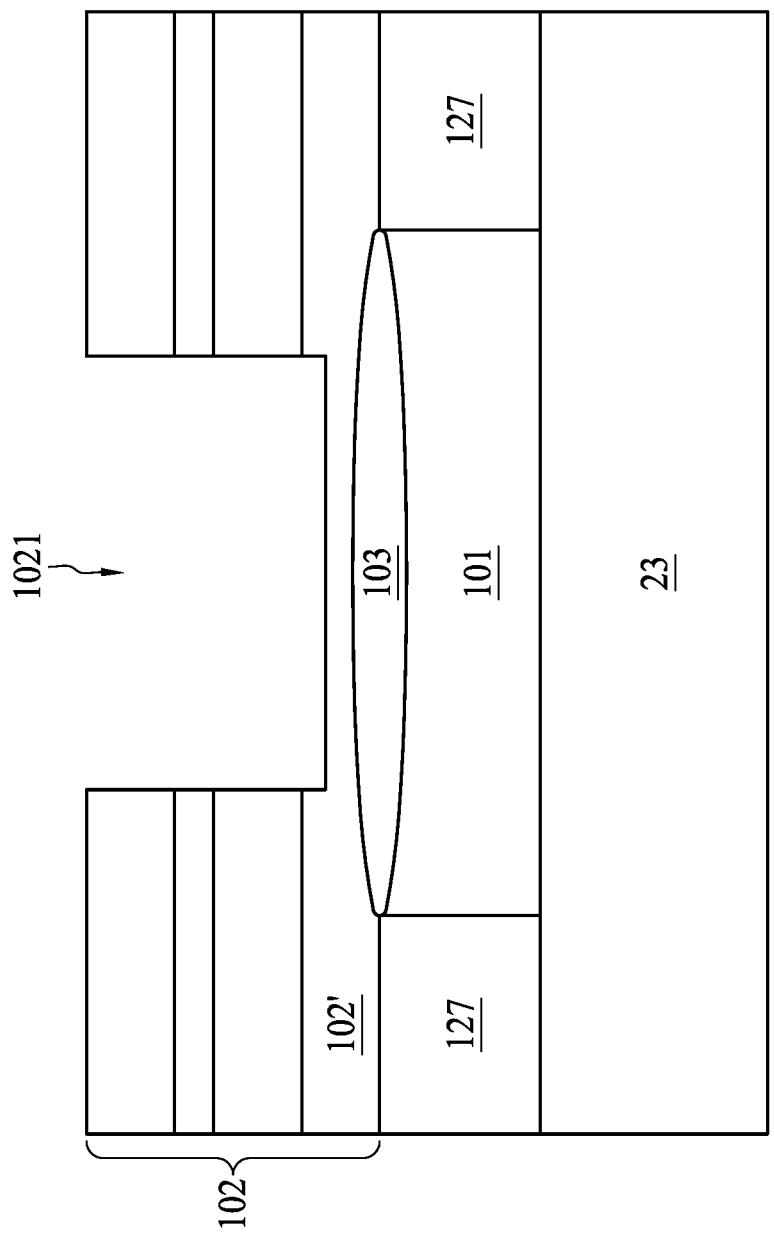

In FIG. 5, a trench 1021 is formed by removing a portion of the dielectric stack 102 above the metal layer 101. In some embodiments, the trench 1021 is formed by etching a portion of the dielectric stack 102, as the etch stops at the silicon-rich silicon nitride (Si-rich SiN) layer 102'.

Figure 6:
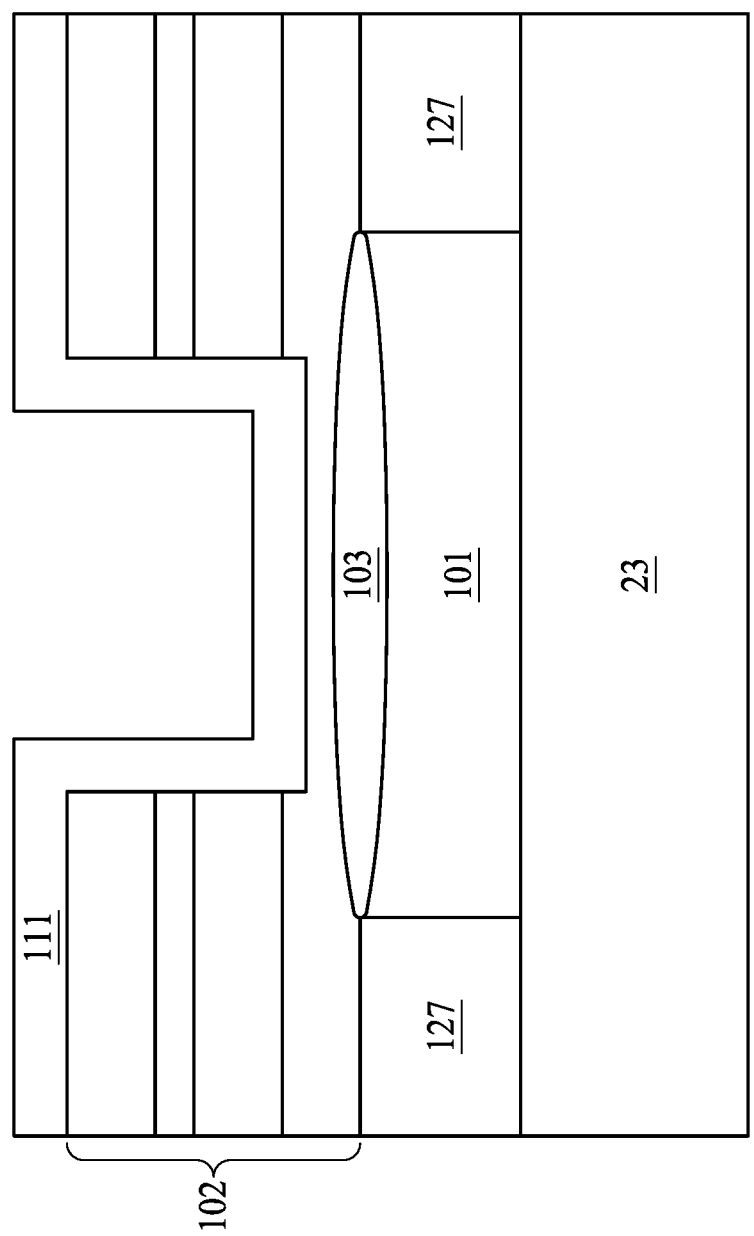

In FIG. 6, the barrier layer 111 is formed above the dielectric stack 102, and the barrier layer 111 also conforms the sidewall of the trench 1021. In some embodiments, the barrier layer 111 is further lined at a bottom surface of the trench 1021. In some embodiments, the barrier layer 111 includes titanium nitride (TiN). The barrier layer 111 may be formed by a variety of techniques, for example, physical vapor deposition (PVD), chemical vapor deposition (CVD), atomic layer deposition (ALD), high-density ionized metal plasma (IMP) deposition, high-density inductively coupled plasma (ICP) deposition, sputtering, low-pressure chemical vapor deposition (LPCVD), plasma-enhanced chemical vapor deposition (PECVD), plasma enhanced atomic layer deposition (PEALD), or the like. In some embodiments, the barrier layer may include titanium oxynitride (TiON). While in some other embodiments, the barrier layer may not include titanium oxynitride (TiON). Note that the barrier layer 111 has a significantly lower etch rate under hydrofluoric etch operation than the dielectric stack 102, as will be discussed subsequently in FIG. 12A.

Figure 7A:
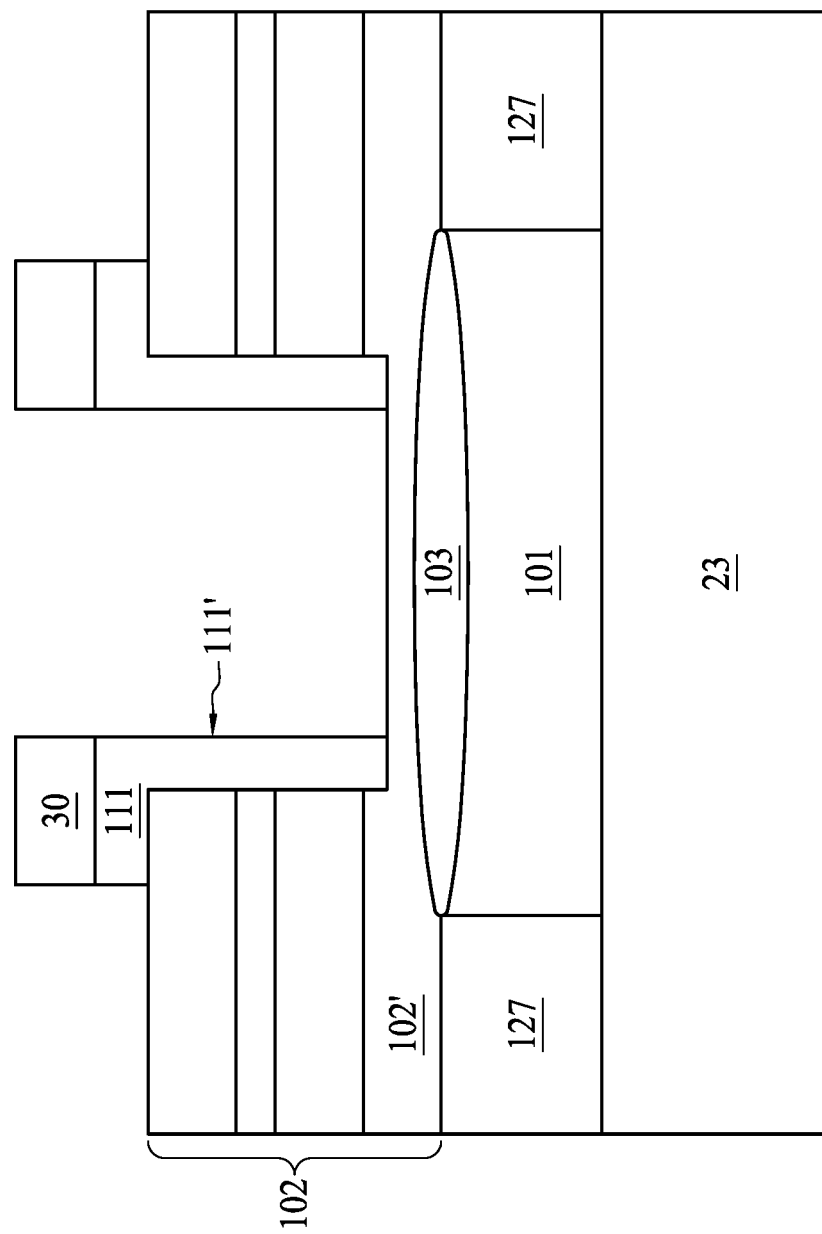
FIGS. 7A, 7B, and 7B' are cross sections of a semiconductor structure at various stages, in accordance with some embodiments of the present disclosure.

In some embodiments, as shown in FIG. 7A, a photoresist layer 30 is patterned above the barrier layer 111. The pattern of the photoresist layer 30 is aligned with an inner sidewall 111' of the barrier layer 111, as the barrier layer 111 at the bottom surface of the trench 1021 within a projection area under the inner sidewall 111' is removed. The silicon-rich silicon nitride (Si-rich SiN) layer 102' is exposed after the removal of the barrier layer 111.

Figure 8A:
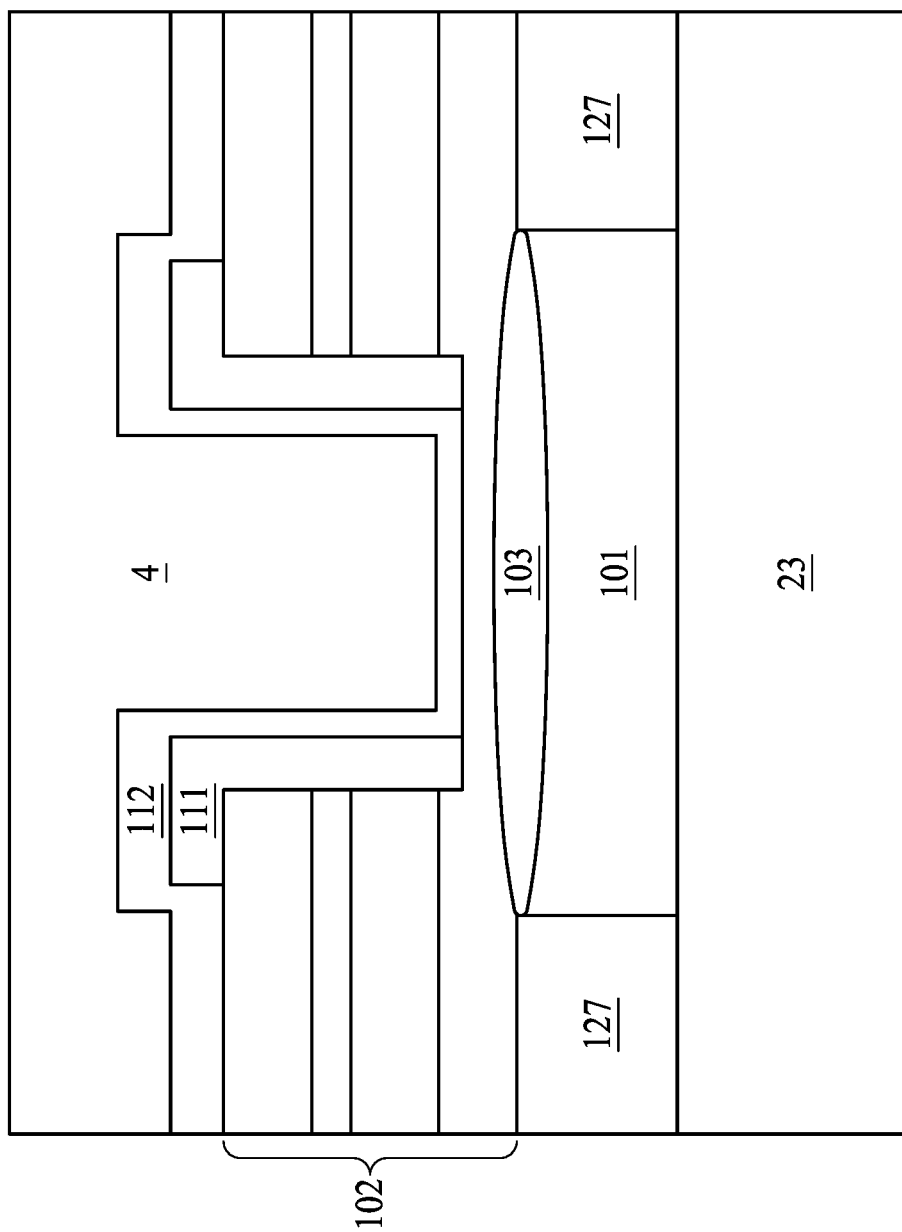
FIGS. 8A and 8B are cross sections of a semiconductor structure at various stages, in accordance with some embodiments of the present disclosure.

Referring to FIG. 8A, a high-k dielectric layer 112 is formed to conform the barrier layer 111. The high-k dielectric layer 112 has a significantly lower etch rate under hydrofluoric etch operation than the dielectric stack 102, as will be discussed subsequently in FIG. 12A. In some embodiments, the high-k dielectric layer 112 may include aluminum oxide ($Al_2O_3$). The high-k dielectric layer 112 may be deposited by a variety of techniques, for example, atomic layer deposition (ALD), laser assisted plasma coating at atmospheric pressure (LAPCAP), physical vapor deposition (PVD), chemical vapor deposition (CVD), high-density ionized metal plasma (IMP) deposition, high-density inductively coupled plasma (ICP) deposition, sputtering, low-pressure chemical vapor deposition (LPCVD), plasma-enhanced chemical vapor deposition (PECVD), plasma enhanced atomic layer deposition (PEALD), or the like. In some embodiments, the preparation process previous to the deposition process includes using water. In some embodiments, the sidewall of the trench 1021 may be oxidized during the process of the deposition of the high-k dielectric layer 112, thereby the barrier layer 111 spacing in between the sidewall of the trench 1021 and the high-k dielectric layer 112 helps prevent the oxidation of the dielectric stack 102. In some embodiments, the surfaces of the barrier layer 111 contacting the high-k dielectric layer 112 may be oxidized during the process of the deposition of the high-k dielectric layer 112, for example, a titanium oxynitride (TiON) layer. Note that in some embodiments, the oxidized form of the barrier layer 111 has a significantly lower etch rate under hydrofluoric etch operation (subsequently discussed in FIG. 12A) than the dielectric stack 102.

A sacrificial layer 4 may be deposited after depositing the high-k dielectric layer 112. The sacrificial layer conforms to the surfaces of the high-k dielectric layer 112. In some embodiments, the sacrificial layer 4 includes oxides, such as Tetraethyl orthosilicate (TEOS). In some embodiments, before depositing the sacrificial layer 4, one or more high aspect ratio trenches (not shown in FIG. 8A) can be formed adjacent to the metal line 101. Thence the sacrificial layer 4 may be filled inside the adjacent high aspect ratio trenches.

Figure 9A:
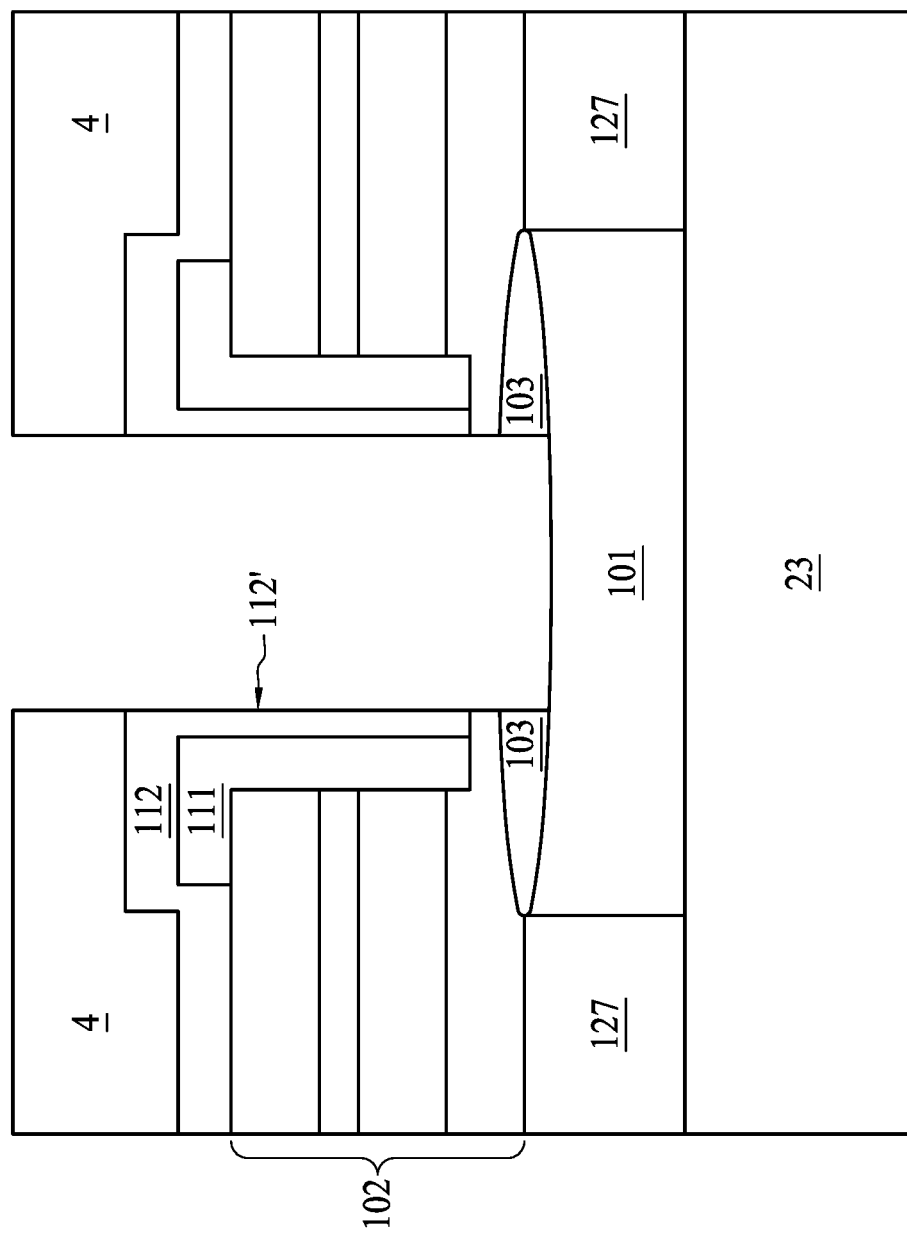
FIGS. 9A and 9B are cross sections of a semiconductor structure at various stages, in accordance with some embodiments of the present disclosure.

In FIG. 9A, a mask pattern (not shown in FIG. 9A) is formed above the sacrificial layer 4, aligning with the inner sidewall 112' of the high-k dielectric layer 112. An etch operation is applied to remove the sacrificial layer 4, the high-k dielectric layer 112, the silicon-rich silicon nitride (Si-rich SiN) layer 102', and the adhesion-enhancing layer 103 within an projection area above or under the inner sidewall 112' of the high-k dielectric layer 112. A portion of top surface of the metal line 101 is exposed after the etch operation.

Figure 10A:
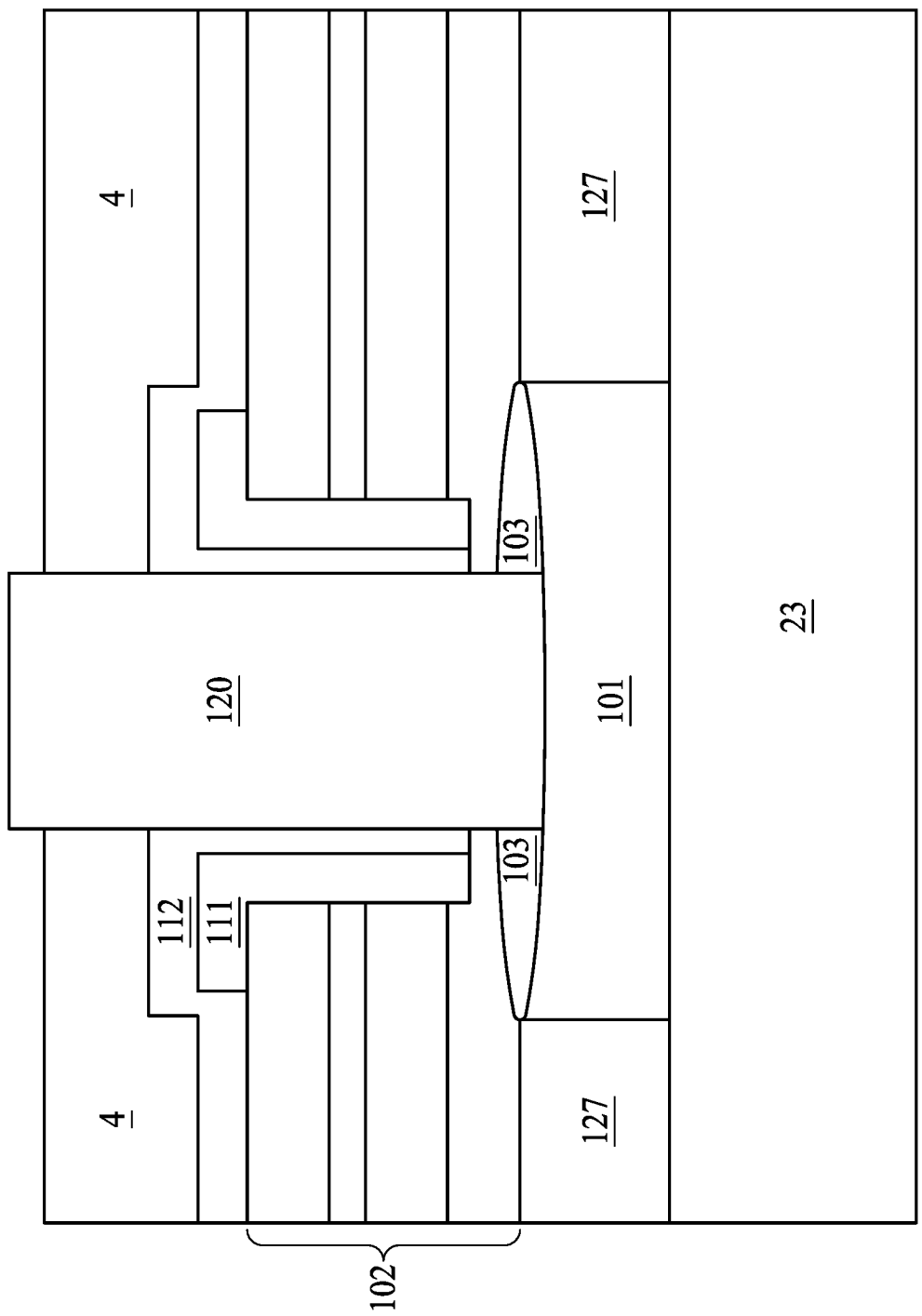
FIGS. 10A and 10B are cross sections of a semiconductor structure at various stages, in accordance with some embodiments of the present disclosure.

In FIG. 10A, the contact 120 is formed in the trench 1021 and connected to the metal layer 101. In some embodiments, the contact 120 has a substantially constant width. In some embodiments, a top surface of the contact 120 is above a top surface of the sacrificial layer 4. In some embodiments, the contact 120 contacts with the inner sidewall 112' (shown in FIG. 9A). In some embodiments, the contact 120 includes one or more types of conductive metal, for example, nickel, gold, the combination of nickel and gold, or the like. In some embodiments, the contact 120 can be formed by applying electroplating.

Figure 11A:
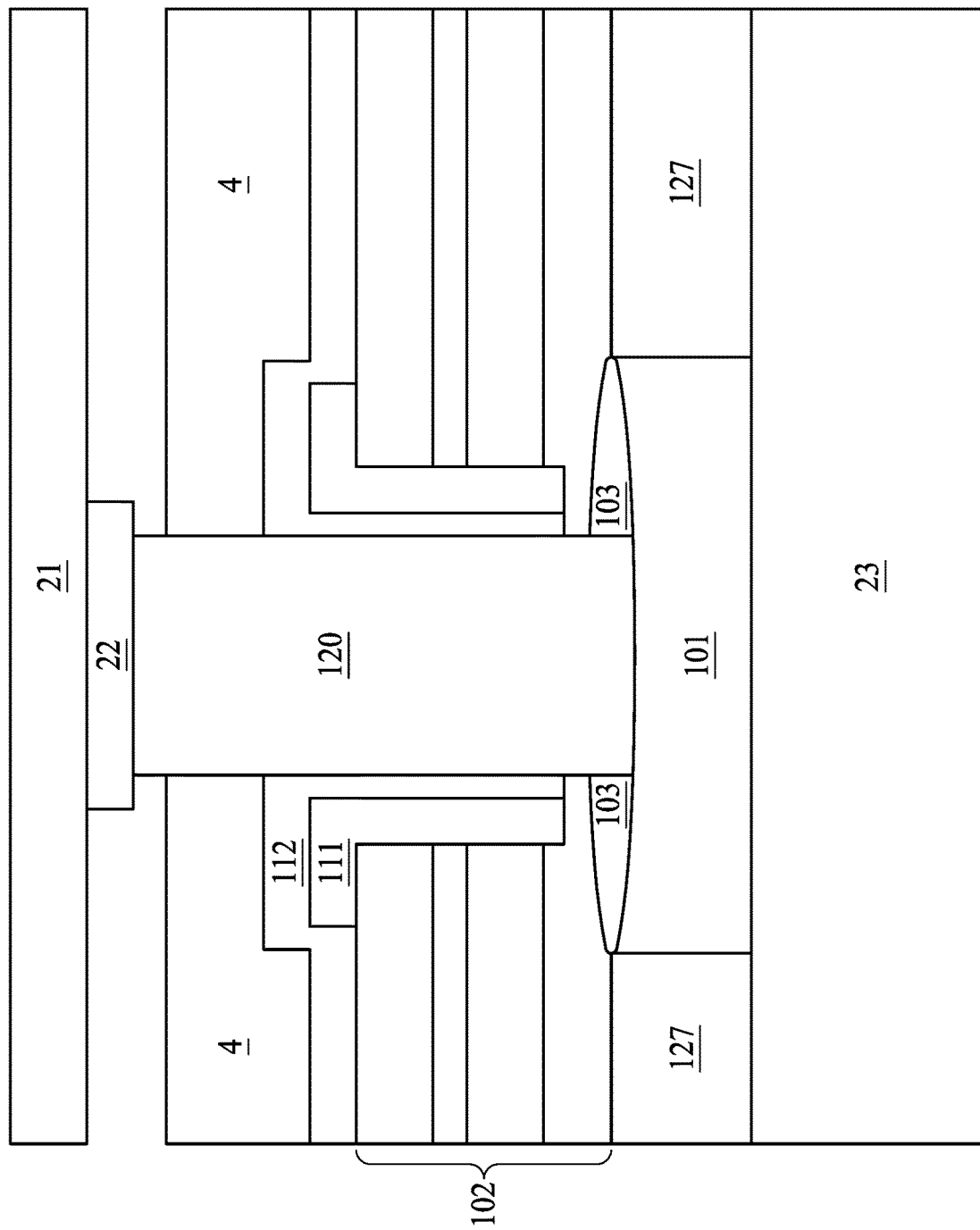
FIGS. 11A and 11B are cross sections of a semiconductor structure at various stages, in accordance with some embodiments of the present disclosure.

In FIG. 11A, the contact 120 is bonded to the glass substrate 21 through the conductive pad 22. In some embodiments, the conductive pad 22 may include conductive metal, such as indium (In). The conductive pad 22 may or may not have the same material with the contact 120.

Figure 12A:
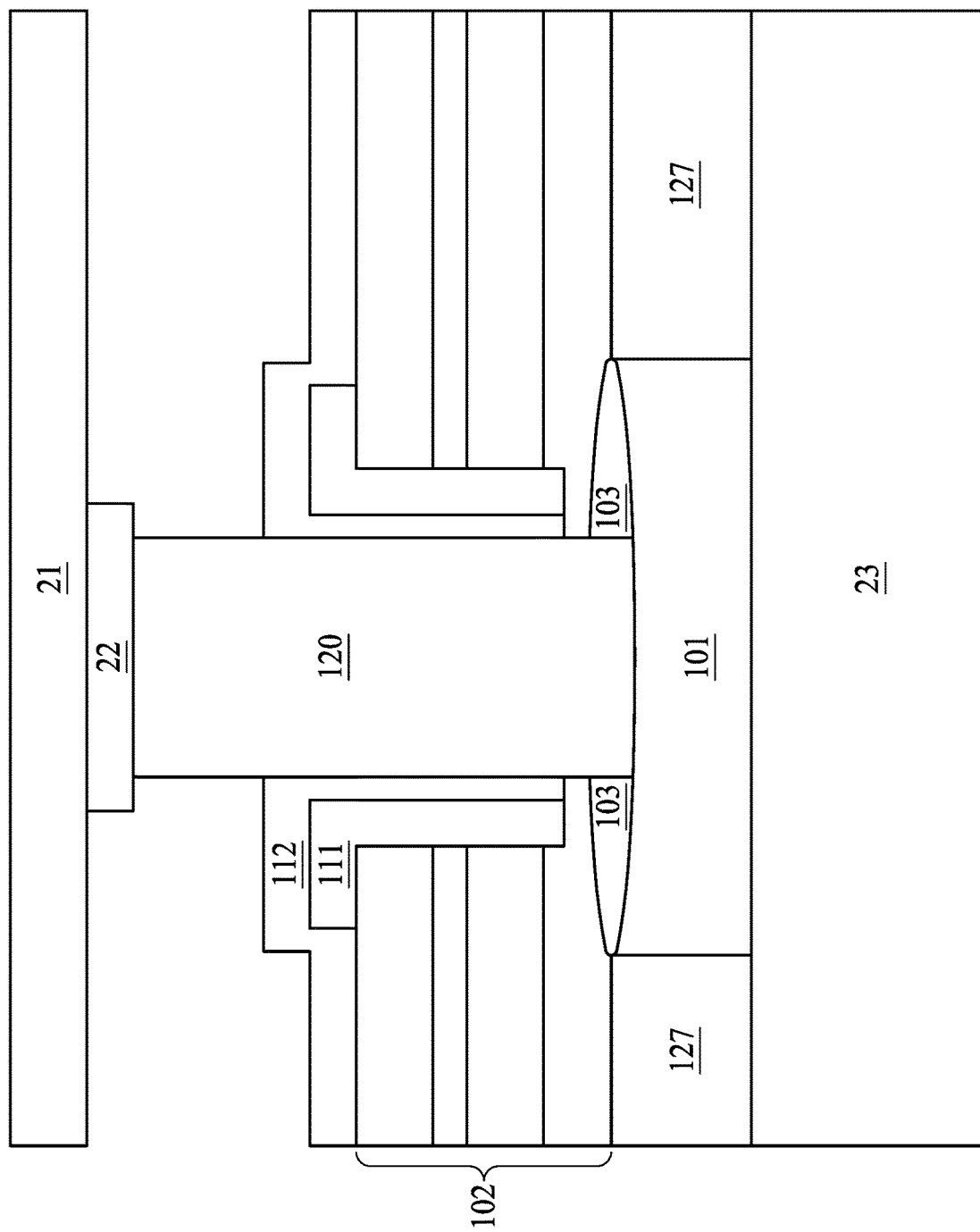
FIGS. 12A and 12B are cross sections of a semiconductor structure at various stages, in accordance with some embodiments of the present disclosure.

In FIG. 12A, after forming the contact 120, the sacrificial layer 4 is removed. In some embodiments, the sacrificial layer 4 is removed by applying hydrofluoric vapor (HF) etching operation. In some embodiments, the hydrofluoric vapor (HF) may flow around the sidewall of the contact 120 throughout the etching operation. Since the dielectric stack 102 may have a high etch rate under the hydrofluoric vapor etching operation, the sidewall of the trench 1021 may be laterally etched. The high-k dielectric layer 112 and the barrier layer 111 with significantly lower etch rate under the hydrofluoric vapor etching operation may be spaced between the dielectric stack 102 and the contact 120 to alleviate the lateral etch on the dielectric stack 102.

In addition, the silicon-rich silicon nitride (Si-rich SiN) has a lower etch rate under hydrofluoride vapor etching process than silicon nitride with lower silicon concentration. Thereby the lateral etch on the silicon-rich silicon nitride (Si-rich SiN) layer 102' may be slower than lateral etch on silicon nitride with lower silicon concentration. After the removal of the sacrificial layer 4, the semiconductor structure may be furtherly used in display transistor manufacturing process.

Figure 7B:
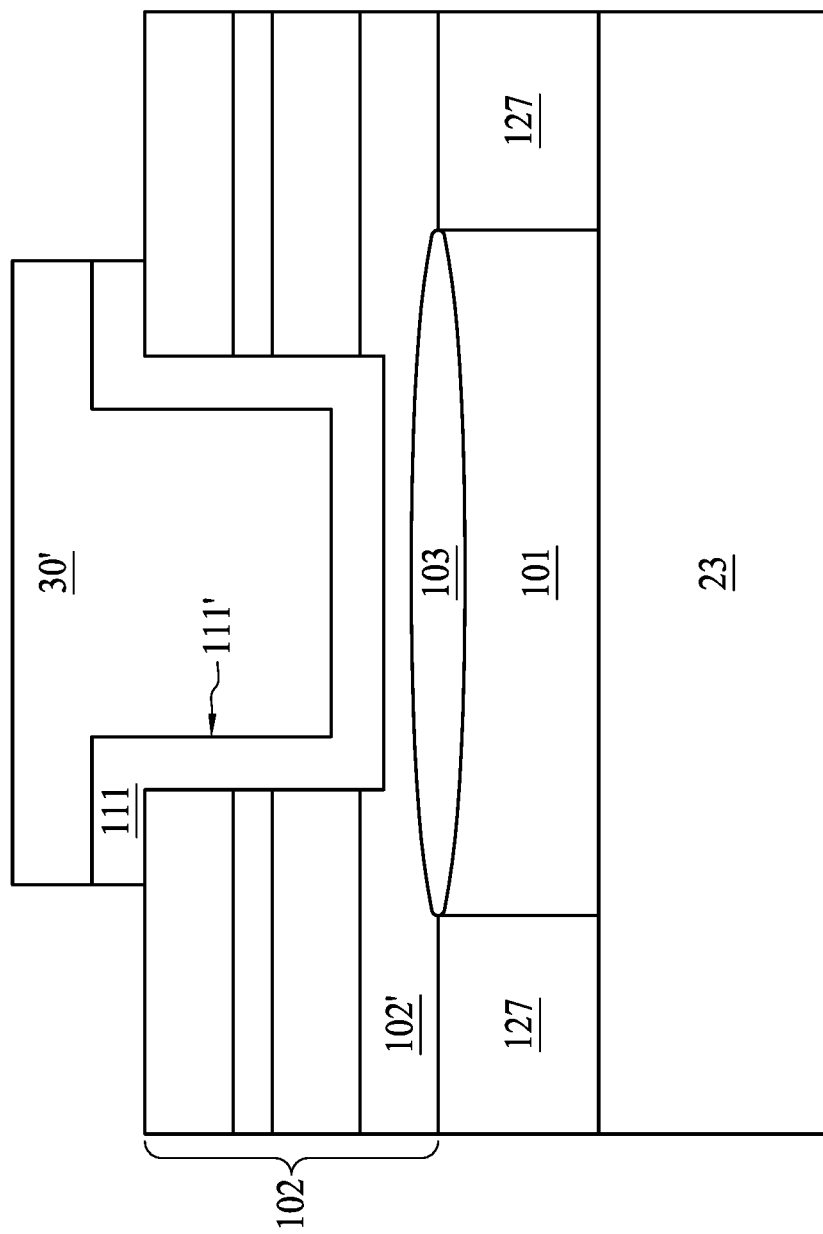

While in some other embodiments, as shown in FIG. 7B and FIG. 7B', following the operation described in FIG. 6, the barrier layer 111 is formed with a different shape comparing to the process previously described in FIG. 7A. As shown in FIG. 7B, a first photoresist layer 30' is patterned above the barrier layer 111 to form a U-shaped barrier layer 111. As illustrated in FIG. 7B', the first photoresist layer 30' is removed and a second photoresist layer 30" having a different profile is patterned over the barrier layer 111, thence a portion of the barrier layer 111 at the bottom surface of the trench 1021 is preserved. The barrier layer 111 at the bottom of the trench 1021 has an inner sidewall 111" substantially parallel to the inner sidewall 111' at the sidewall of the trench 1021. The first opening A1 surrounded by the inner sidewall 111" is smaller than the second opening A2 surrounded by the inner sidewall 111'. The silicon-rich silicon nitride (Si-rich SiN) layer 102' is exposed from the first opening A1. The aforesaid process of shaping the barrier layer 111 may also be completed by applying only one photoresist layer or one hard mask, however, applying at least two photoresist layers or hard masks may control the first opening A1 in a more precise fashion.

Figure 8B:
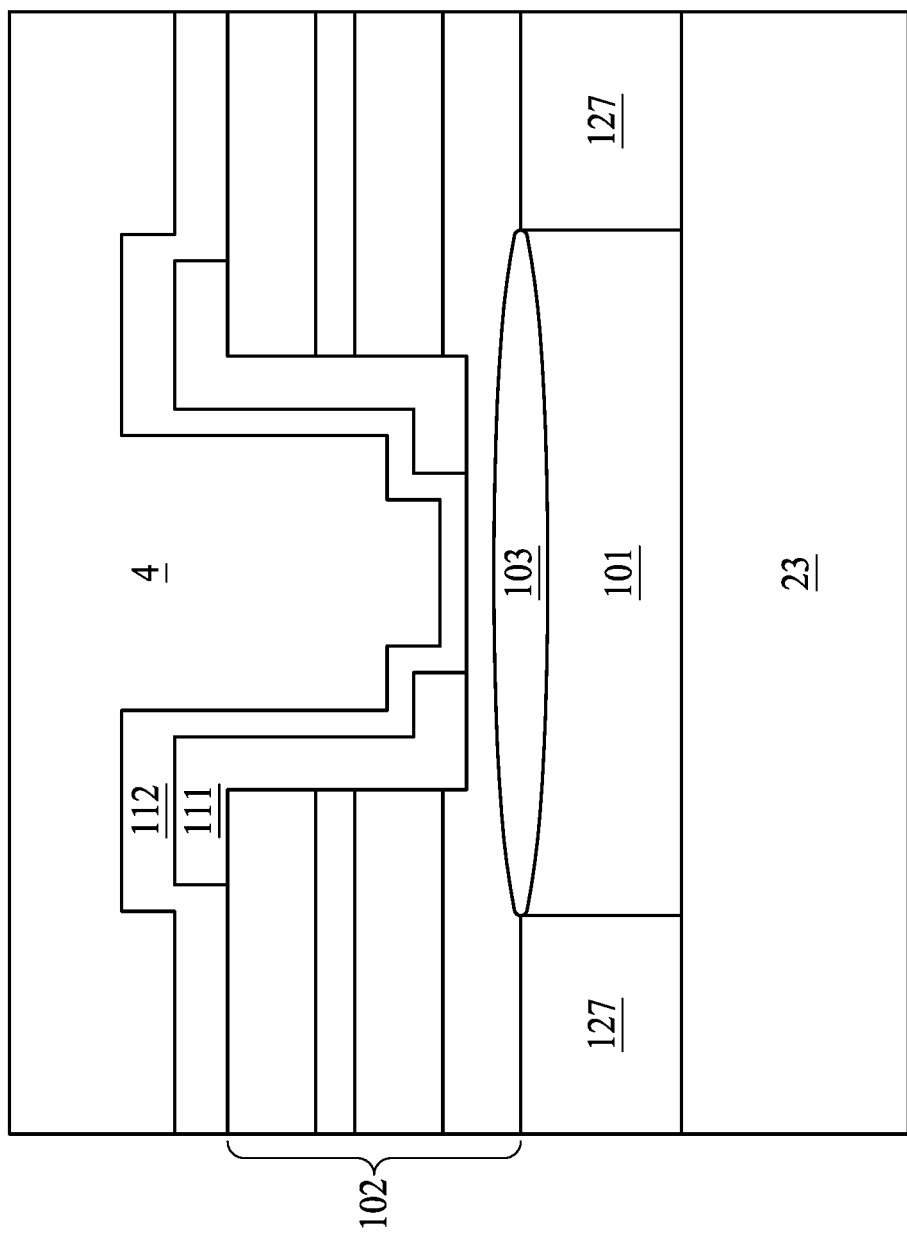

Referring to FIG. 8B, a high-k dielectric layer 112 is formed to conform the surfaces of the barrier layer 111. The high-k dielectric layer 112 has a significantly lower etch rate under hydrofluoric etch operation than the dielectric stack 102, as will be discussed subsequently in FIG. 12B. In some embodiments, the high-k dielectric layer 112 may include aluminum oxide ($Al_2O_3$). The high-k dielectric layer 112 may be deposited by a variety of techniques, for example, atomic layer deposition (ALD), laser assisted plasma coating at atmospheric pressure (LAPCAP), physical vapor deposition (PVD), chemical vapor deposition (CVD), high-density ionized metal plasma (IMP) deposition, high-density inductively coupled plasma (ICP) deposition, sputtering, low-pressure chemical vapor deposition (LPCVD), plasma-enhanced chemical vapor deposition (PECVD), plasma enhanced atomic layer deposition (PEALD), or the like. In some embodiments, the sidewall of the trench 1021 may be oxidized during the process of the deposition of the high-k dielectric layer 112, thereby the barrier layer 111 spacing in between the sidewall of the trench 1021 and the high-k dielectric layer 112 helps prevent the oxidation of the dielectric stack 102. In some embodiments, the surfaces of the barrier layer 111 contacting the high-k dielectric layer 112 may be oxidized during the process of the deposition of the high-k dielectric layer 112, for example, a titanium oxynitride (TiON) layer. Note that in some embodiments, the oxidized form of the barrier layer 111 has a significantly lower etch rate under hydrofluoric etch operation (subsequently discussed in FIG. 12B) than the dielectric stack 102, therefore the lateral etch at the interface between the barrier layer 111 and the high-k dielectric layer 112 is significantly reduced.

A sacrificial layer 4 may be deposited after depositing the high-k dielectric layer 112. The sacrificial layer conforms to the surfaces of the high-k dielectric layer 112. In some embodiments, the sacrificial layer 4 includes oxides, such as Tetraethyl orthosilicate (TEOS). In some embodiments, before depositing the sacrificial layer 4, one or more high aspect ratio trenches (not shown in FIG. 8B) can be formed adjacent to the metal line 101. Thence the sacrificial layer 4 may be filled inside the adjacent high aspect ratio trenches.

Figure 9B:
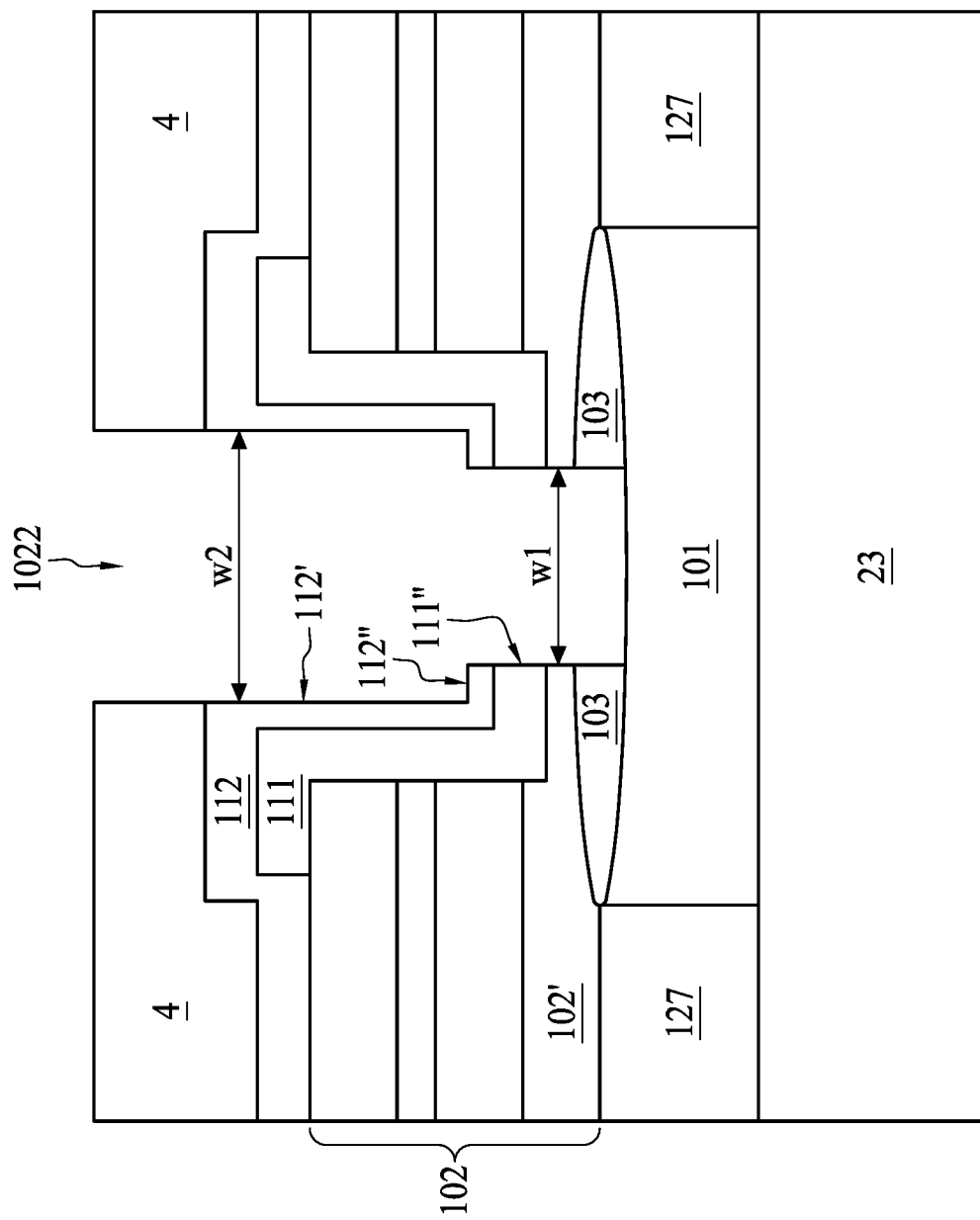

As shown in FIG. 9B, etch operations similar to FIG. 9A can be applied. However, the etch operation may require at least two masking process herein. A first mask (not shown in FIG. 99) is for forming the lower portion of a contact trench 1022, which has a width w1, all the way down to a top surface of the metal line 101. A second mask (not shown in FIG. 9B) is for forming the upper portion of the contact 120 trench, which has a width w2, down to a top surface 112" of the high-k dielectric layer 112 at the bottom. Forming the contact trench 1022 includes removing a portion of the sacrificial layer 4 in the trench 1021, a portion of the high-k dielectric layer 112, a portion of the silicon-rich silicon nitride (Si-rich SiN) layer 102', and a portion of the adhesion-enhancing layer 103. A portion of top surface of the metal line 101 is exposed after the etch operation. The two-section contact 120 with a narrower lower portion may help alleviate the upward diffusion of the copper which will be subsequently discussed in FIG. 12B.

Figure 10B:
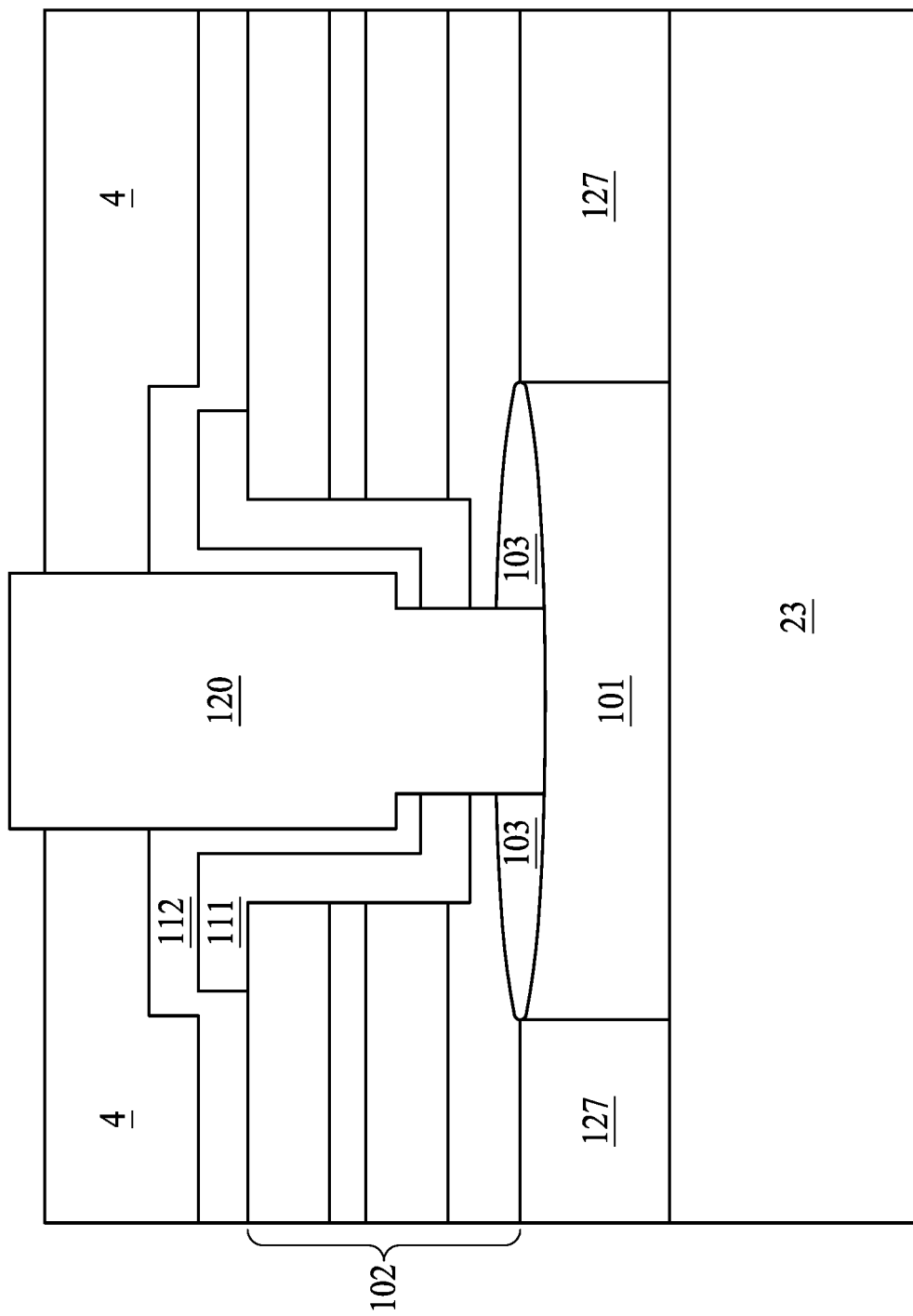

In FIG. 10B, the contact 120 is formed in the contact trench 1022 and connected to the metal layer 101. In some embodiments, a portion of the contact 120 proximal to the metal layer 101 has a first width w1 narrower than a second width w2 of a portion of the contact 120 distal to the metal layer 101. In some embodiments, a top surface of the contact 120 is above a top surface of the sacrificial layer 4. In some embodiments, the contact 120 contacts with the surfaces 112', 112", and 111" (shown in FIG. 9B). Thence a portion of the barrier layer 111 and a portion of the high-k dielectric layer 112 are underneath the contact 120. In some embodiments, the contact 120 includes one or more types of conductive metal, for example, nickel, gold, the combination of nickel and gold, or the like. In some embodiments, the contact 120 can be formed by applying electroplating.

Figure 11B:
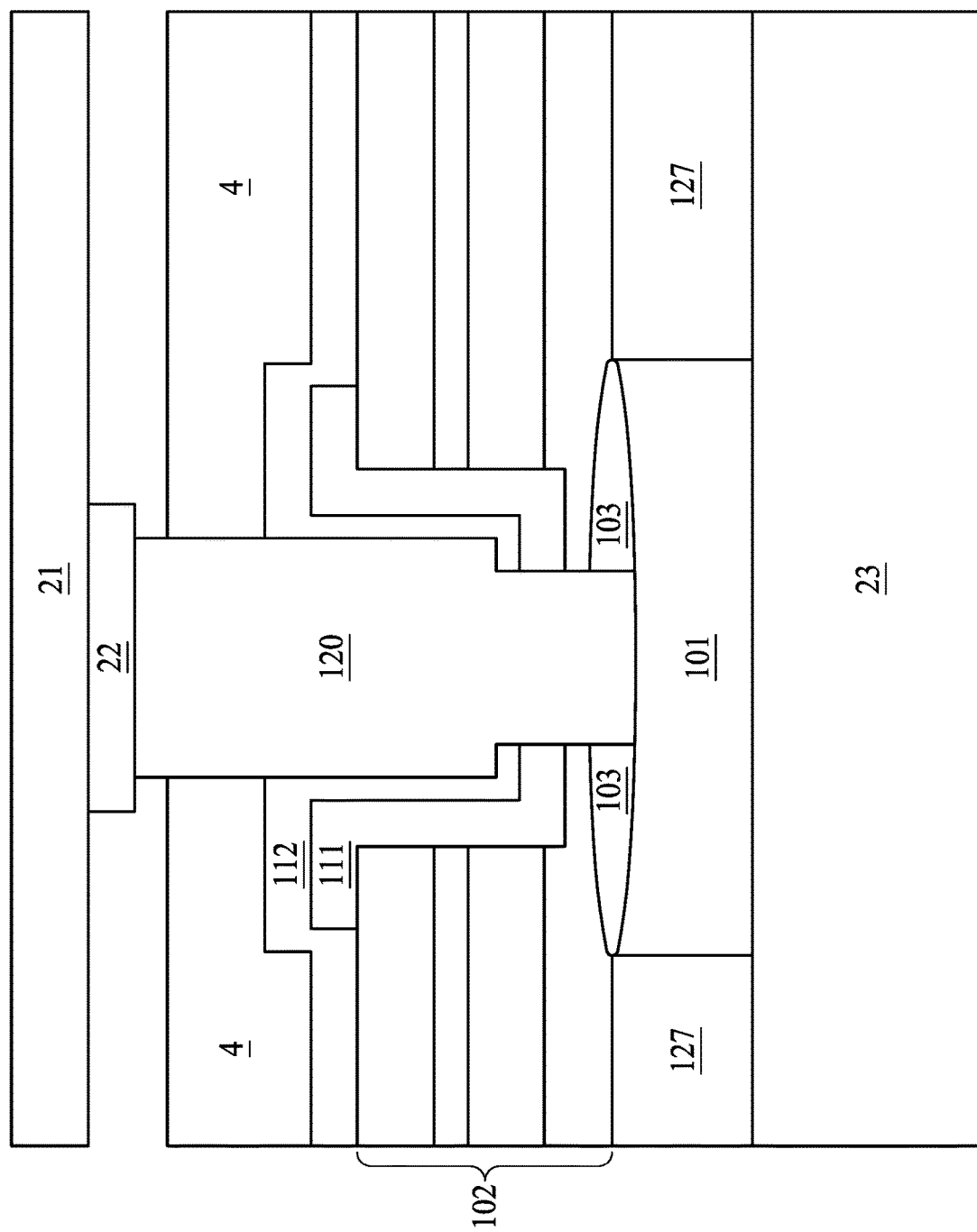

In FIG. 11B, the contact 120 is bonded to the glass substrate 21 through the conductive pad 22. In some embodiments, the conductive pad 22 may include conductive metal, such as indium (In). The conductive pad 22 may or may not have the same material with the contact 120.

Figure 12B:
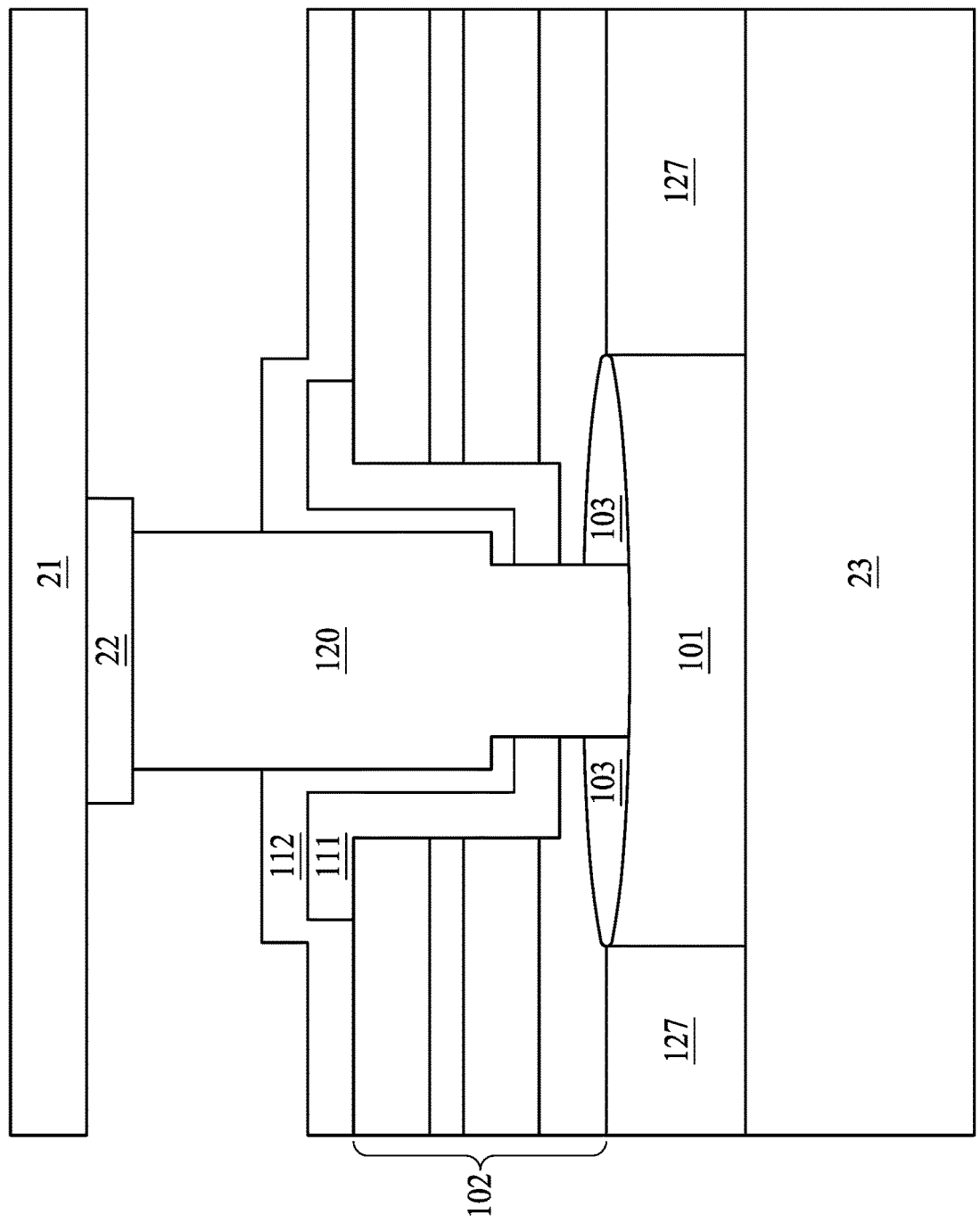

In FIG. 12B, after forming the contact 120, the sacrificial layer 4 is removed. In some embodiments, the sacrificial layer 4 is removed by applying hydrofluoric vapor (HF) etching operation. In some embodiments, the hydrofluoric vapor (HF) may flow around the sidewall of the contact 120 throughout the etching operation. Since the dielectric stack 102 may have a high etch rate under the hydrofluoric vapor etching operation, the sidewall of the trench 1021 may be laterally etched. The high-k dielectric layer 112 and the barrier layer 111 with significantly lower etch rate under the hydrofluoric vapor etching operation may be spaced between the dielectric stack 102 and the contact 120 to alleviate the lateral etch on the dielectric stack 102.

In addition, the silicon-rich silicon nitride (Si-rich SiN) has a lower etch rate under hydrofluoride vapor etching process than silicon nitride with lower silicon concentration. Thereby the lateral etch on the silicon-rich silicon nitride (Si-rich SiN) layer 102' may be slower than lateral etch on silicon nitride with lower silicon concentration. Also, upward diffusion of copper in the metal line 101 may be induced during the hydrofluoride vapor etching process, therefore the two-section contact 120 with a narrower lower portion may help alleviate the upward diffusion of the copper in the metal line 101. In some embodiments, in order to effectively alleviate the upward diffusion of the copper, the opening A1 may be dimensioned to be smaller than 50% of the opening A2, as illustrated in FIG. 7B'. After the removal of the sacrificial layer 4, the semiconductor structure may be furtherly used in display transistor manufacturing process. After the removal of the sacrificial layer 4, the semiconductor structure may be furtherly used in display transistor manufacturing process.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily, appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Some embodiments of the present disclosure provide a semiconductor structure, including a metal layer, an adhesion-enhancing layer over the metal layer, a dielectric stack over the adhesion-enhancing layer, a contact penetrating the dielectric stack, the adhesion-enhancing layer, and connecting with the metal layer, a barrier layer disposed between the contact and the dielectric stack, and a high-k dielectric layer disposed between the contact and the barrier layer.

Some embodiments of the present disclosure provide high voltage display structure, including a semiconductor driver. Wherein the semiconductor driver includes a metal layer, an adhesion-enhancing layer over the metal layer, a dielectric stack over the adhesion-enhancing layer, a contact penetrating the dielectric stack, the adhesion-enhancing layer, and connecting with the metal layer, a barrier layer disposed between the contact and the dielectric stack, a high-k dielectric layer disposed between the contact and the barrier layer, a glass substrate comprising a conductive pad, wherein the glass substrate is bonded to the semiconductor driver through the contact and the conductive pad.

Some embodiments of the present disclosure provide a method for forming a semiconductor structure, including forming a metal layer, forming an adhesion-enhancing layer over the metal layer by a silicide operation, forming a dielectric stack over the adhesion-enhancing layer, forming a trench in the dielectric stack by removing a portion of dielectric stack aligning with the metal layer, forming a barrier layer conforming to the sidewall of the trench, forming a high-k dielectric layer conforming to the barrier layer, forming a contact in the trench and connecting to the metal layer.

What is claimed is:

1. A method for forming a semiconductor structure, comprising:
   forming a metal layer;
   forming an adhesion-enhancing layer over the metal layer by a silicide operation;
   forming a dielectric stack over the adhesion-enhancing layer;
   forming a trench in the dielectric stack by removing a portion of the dielectric stack aligning with the metal layer;
   forming a barrier layer conforming to a sidewall of the trench;
   forming a high-k dielectric layer conforming to the barrier layer, wherein the high-k dielectric layer is different from the barrier layer;
   forming a sacrificial layer conforming to the high-k dielectric layer; and
   forming a contact in the trench and connecting to the metal layer.

2. The method of claim 1, further comprising:
   removing the sacrificial layer after forming the contact.

3. The method of claim 1, wherein forming the adhesion-enhancing layer comprises applying silane over the metal layer.

4. The method of claim 2, wherein forming the dielectric stack comprises forming a silicon-rich silicon nitride interfacing with the adhesion-enhancing layer.

5. The method of claim 4, wherein the sacrificial layer is removed by hydrofluoric vapor.

6. The method of claim 5, further comprising:
   lining the barrier layer at a bottom of the trench; and
   removing at least a portion of the high-k dielectric layer and at least a portion of the barrier layer from the bottom of the trench.

7. The method of claim 6, wherein forming the contact in the trench comprises:
   removing at least a portion of the silicon-rich silicon nitride;
   removing at least a portion of the sacrificial layer in the trench; and
   electroplating metal into the trench.

8. A method for forming a semiconductor structure, comprising:
   forming a metal layer, wherein the metal layer comprises a concave recess profile at a top surface of the metal layer;
   forming an adhesion-enhancing layer on the metal layer;
   forming a dielectric stack having a silicon-rich silicon nitride proximity to a bottom surface of the dielectric stack on the adhesion-enhancing layer;
   forming a trench in the dielectric stack;
   forming a barrier layer conforming to a sidewall of the trench;
   forming a high-k dielectric layer conforming to the barrier layer; and
   forming a contact penetrating the adhesion-enhancing layer and connecting to the metal layer.

9. The method of claim 8, further comprising:
   receiving a dielectric layer; and
   forming an inter-metal dielectric (IMD) on the dielectric layer prior to forming the metal layer in the IMD.

10. The method of claim 8, wherein the adhesion-enhancing layer is formed by introducing silane to the metal layer.

11. The method of claim 8, wherein a bottom of the trench is in the silicon-rich silicon nitride.

12. The method of claim 8, further comprising:
    forming a photoresist layer above the barrier layer;
    patterning the photoresist layer to be aligned with a first inner sidewall of the barrier layer; and
    removing the barrier layer at a bottom surface of the trench within a projection area under the first inner sidewall.

13. The method of claim 8, further comprising:
    forming a photoresist layer above the barrier layer; and
    exposing the silicon-rich silicon nitride by patterning the photoresist layer to remove a portion of the barrier layer at a bottom surface of the trench;
    wherein a first inner surface of the barrier layer is covered by the photoresist layer in exposing the silicon-rich silicon nitride, and a second inner surface of the barrier layer parallel to the first inner surface is exposed from the photoresist layer.

14. The method of claim 13, further comprising:
    forming an opening at a bottom surface of the high-k dielectric layer to expose the metal layer prior to forming the contact;
    wherein a sidewall of a thinner portion of the contact is in contact with the high-k dielectric layer, the barrier layer, the silicon-rich silicon nitride, and the adhesion-enhancing layer.

15. A method for forming a semiconductor structure, comprising:
    forming a semiconductor driver, comprising:
      forming a metal layer;
      forming an adhesion-enhancing layer on the metal layer;
      forming a dielectric stack over the adhesion-enhancing layer;
      forming a trench in the dielectric stack;
      forming a barrier layer conforming to a sidewall of the trench;
      forming a high-k dielectric layer conforming to the barrier layer;
      forming a sacrificial layer on the high-k dielectric layer; and
      forming a contact in the trench and connecting to the metal layer, wherein the contact penetrates through the high-k dielectric layer; and
    bonding the semiconductor driver to a conductive pad of a glass substrate;
    wherein the high-k dielectric layer of the semiconductor driver is spaced from the glass substrate by at least a thickness of the contact.

16. The method of claim 15, wherein a top surface of the contact is higher than a top surface of the sacrificial layer.

17. The method of claim 15, further comprising:
    removing the sacrificial layer after forming the contact by a hydrofluoric vapor (HF) etching operation.

18. The method of claim 15, further comprising:
  forming an opening to expose the metal layer prior to forming the contact;
  wherein a portion of the adhesion-enhancing layer is removed in forming the opening.

19. The method of claim 15, wherein the conductive pad is separated from the sacrificial layer.

20. The method of claim 1, wherein a top surface of the contact is higher than a top surface of the high-k dielectric layer.

* * * * *